US012807480B2

(12) United States Patent
Wu et al.

(10) Patent No.: US 12,807,480 B2
(45) Date of Patent: Nov. 24, 2026

(54) ENCAPSULATION STRUCTURE, SUBSTRATE, AND ENCAPSULATION METHOD

(71) Applicant: HUAWEI TECHNOLOGIES CO., LTD., Shenzhen (CN)

(72) Inventors: Guoqiang Wu, Wuhan (CN); Shangshu Yang, Wuhan (CN); Jinghui Xu, Shenzhen (CN); Zhongye Wu, Wuhan (CN); Qifang Hu, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 616 days.

(21) Appl. No.: 18/360,926

(22) Filed: Jul. 28, 2023

(65) Prior Publication Data

US 2023/0365400 A1 Nov. 16, 2023

Related U.S. Application Data

(63) Continuation of application No. PCT/CN2022/070634, filed on Jan. 7, 2022.

(30) Foreign Application Priority Data

Jan. 29, 2021 (CN) ......................... 202110127666.3

(51) Int. Cl.
*B81B 7/00* (2006.01)
*B81C 1/00* (2006.01)

(52) U.S. Cl.
CPC ........ *B81B 7/0048* (2013.01); *B81C 1/00325* (2013.01); *B81C 2201/019* (2013.01)

(58) Field of Classification Search
CPC .............. B81B 7/0048; B81C 1/00325; B81C 2201/019
See application file for complete search history.

(56) References Cited

U.S. PATENT DOCUMENTS 10,696,546 B1 6/2020 Perahia et al.
2003/0033974 A1 2/2003 Ueda
(Continued)

FOREIGN PATENT DOCUMENTS

CN 1678513 A 10/2005
CN 104418286 A 3/2015
(Continued)

OTHER PUBLICATIONS

PCT International Search Report for Application No. PCT/CN2022/070634 dated Jan. 7, 2022, 10 pages.
(Continued)

*Primary Examiner* — Samuel A Gebremariam

(57) ABSTRACT

The technology of this application relates to an encapsulation structure that includes a micro-electromechanical system (MEMS) device, a substrate, and an attachment material. Materials included in the substrate include at least a first-type material and a second-type material, a coefficient of thermal expansion of the first-type material is less than a coefficient of thermal expansion of a base material of the MEMS device, and a coefficient of thermal expansion of the second-type material is greater than the coefficient of thermal expansion of the base material of the MEMS device. The attachment material is located between the MEMS device and the substrate, and is configured to attach the MEMS device to the substrate. The substrate includes a plurality of different materials.

20 Claims, 9 Drawing Sheets

(56) References Cited

U.S. PATENT DOCUMENTS

| | | | |
|---|---|---|---|
| 2012/0049300 | A1 | 3/2012 | Yamaguchi et al. |
| 2016/0229689 | A1 | 8/2016 | Kaanta et al. |

FOREIGN PATENT DOCUMENTS

| | | | | |
|---|---|---|---|---|
| CN | 105895672 | A | | 8/2016 |
| CN | 110143565 | A | | 8/2019 |
| CN | 210108566 | U | | 2/2020 |
| CN | 109698137 | B | | 9/2020 |
| JP | 34113695 | | * | 12/2018 |
| TW | 504809 | B | | 10/2002 |

OTHER PUBLICATIONS

Wu Zhongye et al:"Ultra-Low Stress Die Attachment Based on a Stacked Multilayer Substrate", Journal of Microelectromechanical Systems , IEEE Service Center, US, vol. 30, No. 4, May 11, 2021(May 11, 2021), pp. 497-499, XP011866128.

Extended European Search Report EP Application No. 22745014.5 dated Jun. 5, 2024, 8 pages.

* cited by examiner

ENCAPSULATION STRUCTURE, SUBSTRATE, AND ENCAPSULATION METHOD

CROSS-REFERENCE TO RELATED APPLICATIONS

This application is a continuation of International Application No. PCT/CN2022/070634, filed on Jan. 7, 2022, which claims priority to Chinese Patent Application No. 202110127666.3, filed on Jan. 29, 2021. The disclosures of the aforementioned applications are hereby incorporated by reference in their entireties.

TECHNICAL FIELD

This application relates to the field of die encapsulation, and more specifically, to an encapsulation structure, a substrate, and an encapsulation method.

BACKGROUND

Micro-electromechanical system (MEMS) device-level encapsulation usually includes processes such as die attachment, wire bonding, sealing, and hermetic welding. Studies show that an encapsulation stress generated by wire bonding and another process is less than 2% of a total encapsulation stress. For example, a MEMS device includes a microsensor. An encapsulation stress of the microsensor that is generated in an attachment process is a main source of stress in an encapsulation process of the microsensor. The encapsulation stress of the microsensor that is generated in the attachment process directly causes warpage and deformation of a microstructure of the die.

SUMMARY

This application provides an encapsulation structure, a substrate, and an encapsulation method, to reduce an encapsulation stress of a MEMS device that is generated in an attachment process.

According to a first aspect, an encapsulation structure is provided. The encapsulation structure may include: a MEMS device; a substrate, including a plurality of different materials, where the plurality of different materials include a first-type material and a second-type material, a coefficient of thermal expansion of the first-type material is less than a coefficient of thermal expansion of a base material of the MEMS device, and/or a coefficient of thermal expansion of the second-type material is greater than the coefficient of thermal expansion of the base material of the MEMS device; and an attachment material, located between the MEMS device and the substrate, and configured to attach the MEMS device to the substrate.

For example, the MEMS device is a microsensor. For example, the MEMS device is a sensor die, or a stacked structure of a sensor die and a readout circuit die. By way of example and not limitation, the MEMS device in this embodiment of this application may alternatively be a microsensor.

For example, the MEMS device is attached to the substrate by using the attachment material, and the materials included in the substrate include the first-type material and the second-type material, so that an encapsulation stress and/or deformation of the MEMS device that are/is generated in an attachment process can be less than a preset threshold. Alternatively, the MEMS device is attached to the substrate by using the attachment material, and the materials included in the substrate include the first-type material and the second-type material, so that an encapsulation stress and/or deformation of the MEMS device that are/is generated in an attachment process can be in a preset range. Alternatively, the MEMS device is attached to the substrate by using the attachment material, and the materials included in the substrate include the first-type material and the second-type material, so that an encapsulation stress and/or deformation of the MEMS device that are/is generated in an attachment process can be controlled. By way of example and not limitation, in some cases, the encapsulation stress of the MEMS device that is generated in the attachment process is 0 or approaches 0. The preset threshold or the preset range may be determined based on an actual requirement during actual application.

Based on the technical solutions, in the encapsulation structure provided in this embodiment of this application, the substrate may be designed to include the plurality of different materials, to adjust properties of the materials in the substrate in a controllable manner. For example, proportions of different materials included in the substrate, thickness of layers at which different materials are located, or a contact area between the layers at which different materials are located are adjusted, to adjust a coefficient of thermal expansion, stiffness, density, and the like of the substrate in a controllable manner. The properties of the materials in the substrate are adjusted in a controllable manner, to adjust and reduce an encapsulation stress of the MEMS device (for example, a microsensor) that is generated due to a mismatch between the coefficient of thermal expansion of the MEMS device and a coefficient of thermal expansion of the substrate in an attachment process, to adjust deformation of the MEMS device.

In addition, according to this embodiment of this application, a substrate suitable for the MEMS device may be selected based on different MEMS devices. For example, proportions of different materials in the substrate suitable for the MEMS device, thickness of layers at which different materials are located, or a contact area between layers at which different materials are located is determined.

According to a second aspect, a substrate is provided. The substrate may include a plurality of different materials. The plurality of different materials include a first-type material and a second-type material, a coefficient of thermal expansion of the first-type material is less than a coefficient of thermal expansion of a base material of a MEMS device, and/or a coefficient of thermal expansion of the second-type material is greater than the coefficient of thermal expansion of the base material of the MEMS device. The substrate is connected to the MEMS device by using an attachment material.

Based on the technical solutions, the substrate may include the plurality of different materials, to adjust properties of the materials in the substrate in a controllable manner. For example, proportions of different materials included in the substrate, thickness of layers at which different materials are located, or a contact area between the layers at which different materials are located are adjusted, to adjust a coefficient of thermal expansion, stiffness, density, and the like of the substrate in a controllable manner. The properties of the materials in the substrate are adjusted in a controllable manner, to adjust and reduce an encapsulation stress of the MEMS device that is generated due to a mismatch between the coefficient of thermal expansion of the MEMS device and a coefficient of thermal expansion of the substrate in an attachment process, to adjust deformation of the MEMS device.

With reference to the first aspect or the second aspect, in some implementations, the first-type material includes quartz glass; and/or the second-type material includes one or more of the following: aluminum oxide, silicon nitride, and aluminum nitride.

With reference to the first aspect or the second aspect, in some implementations, the substrate is a multi-layer structure formed by stacking the plurality of different materials.

For example, the substrate may include X layers of single-layer materials, that is, each layer may include one type of material, and X is an integer greater than or equal to 2.

Based on the technical solutions, the substrate may be a multi-layer structure formed by stacking the plurality of different materials.

With reference to the first aspect or the second aspect, in some implementations, materials of adjacent layers in the multi-layer structure are different.

For example, the first-type material and the second-type material are used as an example. The substrate may be formed by stacking the first-type material and the second-type material based on a specific period.

With reference to the first aspect or the second aspect, in some implementations, an encapsulation stress of the MEMS device is related to one or more of the following: a thickness proportion of each layer in the multi-layer structure, a contact area or an attachment area between layers in the multi-layer structure, and an attachment area between the multi-layer structure and the MEMS device.

For example, the layers in the multi-layer structure may be sequentially stacked and attached by using the attachment material. In this case, an area of the attachment material between the layers may be adjusted, to adjust the attachment area between the layers.

Based on the technical solutions, the encapsulation stress of the MEMS device is related to one or more of the following: the thickness proportion of each layer in the multi-layer structure, the contact area or the attachment area between layers in the multi-layer structure, and the attachment area between the multi-layer structure and the MEMS device. Therefore, the encapsulation stress of the MEMS device layer may be controlled by adjusting any one or more of the foregoing. For example, any one or more of the foregoing may be adjusted, to reduce the encapsulation stress, and reduce deformation caused by the encapsulation stress of the MEMS device.

With reference to the first aspect or the second aspect, in some implementations, that the substrate is a multi-layer structure formed by stacking the plurality of different materials includes: The substrate is prepared by bonding the plurality of different materials in a die-level or wafer-level bonding manner; the substrate is prepared by growing or depositing the plurality of different materials in a film growth manner; or the substrate is formed by attaching the plurality of different materials in an attachment manner.

Based on the technical solutions, the substrate may be prepared by alternately bonding the first-type material and the second-type material in a bonding manner (for example, a die-level or wafer-level bonding manner) in sequence. Alternatively, the substrate may be prepared by alternately bonding the first-type material and the second-type material in a film growth manner in sequence. Alternatively, the substrate may be prepared in a manner combining film growth and bonding. Alternatively, the substrate may be prepared by sequentially stacking and attaching the first-type material and the second-type material by using the attachment material. This is not limited.

With reference to the first aspect or the second aspect, in some implementations, the substrate is formed by mixing the plurality of different materials based on a preset proportion.

For example, the preset proportion may be a mass proportion of the first-type material in the substrate, a mass proportion of the first-type material to the second-type material in the substrate, or a mass proportion of the second-type material in the substrate.

For example, the preset proportion indicates the mass proportion of the first-type material in the substrate. The preset proportion may be determined in the following manner: keeping total mass of the substrate unchanged, to obtain substrates with different mass proportions of the first-type material. The MEMS device is separately attached to the substrates with different mass proportions of first-type materials by using a patch adhesive. Deformation of the MEMS device is measured after curing and cooling of the substrates with different proportions. For example, a mass proportion, of the first-type material, corresponding to a smallest deformation value of the MEMS device may be selected as the proportion, namely, the preset proportion, of the first-type material in the final substrate.

Based on the technical solutions, the substrate is a composite material layer structure formed by mixing the plurality of different materials.

With reference to the first aspect or the second aspect, in some implementations, an encapsulation stress of the MEMS device is related to the proportions of the plurality of different materials in the substrate.

Based on the technical solutions, the encapsulation stress of the MEMS device may be related to the proportions (for example, mass proportions) of the plurality of different materials in the substrate. Therefore, the proportions of the plurality of different materials in the composite material substrate may be adjusted, to control the encapsulation stress of the MEMS device. For example, the proportions of the plurality of different materials in the composite material substrate may be adjusted, so that an effective coefficient of thermal expansion of the substrate approaches the coefficient of thermal expansion of the substrate of the MEMS device. This can further reduce the encapsulation stress, and reduce deformation of the MEMS device caused by the encapsulation stress.

With reference to the first aspect or the second aspect, in some implementations, a material of the MEMS device includes one or more of the following: monocrystalline silicon, silicon carbide, diamond, and gallium nitride.

With reference to the first aspect or the second aspect, in some implementations, the attachment material includes one or more of the following: epoxy resin, a resin alternative, metal solder, and glass powder.

With reference to the first aspect or the second aspect, in some implementations, the substrate includes one or more of the following: an electrical connection through hole, a metal lead, and a metal pad.

With reference to the first aspect or the second aspect, in some implementations, the MEMS device is electrically interconnected to the outside by using the substrate in a wire bonding manner.

With reference to the first aspect or the second aspect, in some implementations, the MEMS device is encapsulated through plastic encapsulation by filling an adhesive from a front surface of the MEMS device.

According to a third aspect, an encapsulation method is provided. The method may include: processing a plurality of different materials, to obtain a substrate, where the plurality of different materials include a first-type material and a second-type material, a coefficient of thermal expansion of the first-type material is less than a coefficient of thermal expansion of a base material of a MEMS device, and/or a coefficient of thermal expansion of the second-type material is greater than the coefficient of thermal expansion of the base material of the MEMS device; and attaching the MEMS device to the substrate by using an attachment material.

Based on the technical solutions, the substrate may include the plurality of different materials, to adjust properties of the materials in the substrate in a controllable manner. For example, proportions of different materials included in the substrate, thickness of layers at which different materials are located, or a contact area between the layers at which different materials are located are adjusted, to adjust a coefficient of thermal expansion, stiffness, density, and the like of the substrate in a controllable manner. The properties of the materials in the substrate are adjusted in a controllable manner, to adjust and reduce an encapsulation stress of the MEMS device that is generated due to a mismatch between the coefficient of thermal expansion of the MEMS device and a coefficient of thermal expansion of the substrate in an attachment process, to adjust deformation of the MEMS device.

For example, the properties of the materials included in the substrate may be determined based on the MEMS device, for example, proportions of different materials included in the substrate, thickness of layers at which different materials are located, or a contact area between layers at which different materials are located is determined.

With reference to the third aspect, in some implementations of the third aspect, the first-type material includes quartz glass; and/or the second-type material includes one or more of the following: aluminum oxide, silicon nitride, and aluminum nitride.

With reference to the third aspect, in some implementations of the third aspect, the processing a plurality of different materials, to obtain a substrate includes: stacking the plurality of different materials, to obtain the substrate with a multi-layer structure.

With reference to the third aspect, in some implementations of the third aspect, materials of adjacent layers in the multi-layer structure are different.

With reference to the third aspect, in some implementations of the third aspect, the encapsulation method further includes one or more of the following: adjusting a thickness proportion of each layer in the multi-layer structure, to control an encapsulation stress of the MEMS device; adjusting a contact area or an attachment area between layers in the multi-layer structure, to control the encapsulation stress of the MEMS device; and adjusting an attachment area between the multi-layer structure and the MEMS device, to control the encapsulation stress of the MEMS device.

With reference to the third aspect, in some implementations of the third aspect, the stacking the plurality of different materials includes: bonding the plurality of different materials in a die-level or wafer-level bonding manner; growing or depositing the plurality of different materials in a film growth manner; or attaching the plurality of different materials in an attachment manner.

With reference to the third aspect, in some implementations of the third aspect, the processing a plurality of different materials, to obtain a substrate includes: mixing the plurality of different materials based on a preset proportion, to obtain the substrate.

With reference to the third aspect, in some implementations of the third aspect, the method further includes: adjusting the proportions of the plurality of different materials, to control an encapsulation stress of the MEMS device.

According to a fourth aspect, an encapsulation method is provided. The method may include: stacking a plurality of different materials, to obtain a substrate with a multi-layer structure; and adjusting one or more of the following, to control an encapsulation stress of a MEMS device attached to the substrate: a thickness proportion of each layer in the multi-layer structure, a contact area or an attachment area between layers in the multi-layer structure, and an attachment area between the multi-layer structure and the MEMS device.

With reference to the fourth aspect, in some implementations of the fourth aspect, the stacking a plurality of different materials includes: bonding the plurality of different materials in a die-level or wafer-level bonding manner; growing or depositing the plurality of different materials in a film growth manner; or attaching the plurality of different materials in an attachment manner.

With reference to the fourth aspect, in some implementations of the fourth aspect, the plurality of different materials include a first-type material and a second-type material, a coefficient of thermal expansion of the first-type material is less than a coefficient of thermal expansion of a base material of the MEMS device, and/or a coefficient of thermal expansion of the second-type material is greater than the coefficient of thermal expansion of the base material of the MEMS device.

According to a fifth aspect, an encapsulation method is provided. The method may include: mixing a plurality of different materials, to obtain a substrate; and adjusting proportions of the plurality of different materials, to control an encapsulation stress of a MEMS device attached to the substrate.

With reference to the fifth aspect, in some implementations of the fifth aspect, the plurality of different materials include a first-type material and a second-type material, a coefficient of thermal expansion of the first-type material is less than a coefficient of thermal expansion of a base material of the MEMS device, and/or a coefficient of thermal expansion of the second-type material is greater than the coefficient of thermal expansion of the base material of the MEMS device.

According to a sixth aspect, an encapsulation structure is provided. The encapsulation structure may include: a MEMS device; a substrate, formed by a quartz glass material; and an attachment material, located between the MEMS device and the substrate, and is configured to attach the MEMS device to the substrate.

According to a seventh aspect, a substrate is provided. The substrate is formed by a quartz glass material, and the substrate is connected to a MEMS device by using an attachment material.

Based on the technical solutions, quartz glass whose coefficient of thermal expansion is less than a coefficient of thermal expansion of a material of the MEMS device is used to compensate for an encapsulation stress, to adjust and reduce an encapsulation stress of the MEMS device that is generated due to a mismatch between a coefficient of thermal expansion of a die and a coefficient of thermal expansion of the substrate in an attachment process of the die.

With reference to the sixth aspect or the seventh aspect, in some implementations, the encapsulation stress of the MEMS device is related to one or more of the following: thickness of the substrate, and an attachment area between the substrate and the MEMS device.

Based on the technical solutions, when the quartz glass substrate is used, thickness of the quartz glass substrate may be changed, to adjust stiffness of the substrate in a controllable manner. As the thickness of the quartz glass substrate increases, maximum deformation (encapsulation stress) of a MEMS device die may gradually decrease. In addition, an attachment area (for example, an area of a patch adhesive) between the quartz glass substrate and the MEMS device may be changed. As the attachment area (for example, an area of a patch adhesive) decreases, maximum deformation (encapsulation stress) of the MEMS device die may gradually decrease. Therefore, the thickness of the quartz glass substrate and/or the attachment area (for example, an area of a patch adhesive) between the quartz glass substrate and the MEMS device are/is adjusted, to adjust the encapsulation stress of the MEMS device die in a controllable manner.

With reference to the sixth aspect or the seventh aspect, in some implementations, a material of the MEMS device includes one or more of the following: monocrystalline silicon, silicon carbide, diamond, and gallium nitride; and/or the attachment material includes one or more of the following: epoxy resin, a resin alternative, metal solder, and glass powder.

With reference to the sixth aspect or the seventh aspect, in some implementations, the substrate includes one or more of the following: an electrical connection through hole, a metal lead, and a metal pad.

With reference to the sixth aspect or the seventh aspect, in some implementations, the MEMS device is electrically interconnected to the outside by using the substrate in a wire bonding manner.

With reference to the sixth aspect or the seventh aspect, in some implementations, the MEMS device is encapsulated through plastic encapsulation by filling an adhesive from a front surface of the MEMS device.

With reference to the sixth aspect or the seventh aspect, in some implementations, the MEMS device is a sensor die, or a stacked structure of a sensor die and a readout circuit die.

According to an eighth aspect, an encapsulation method is provided. The method may include: processing a quartz glass material, to obtain a substrate; attaching a MEMS device to the substrate by using an attachment material.

With reference to the eighth aspect, in some implementations of the eighth aspect, the encapsulation method further includes: adjusting thickness of the substrate, to control an encapsulation stress of the MEMS device; and/or adjusting an attachment area between the substrate and the MEMS device, to control the encapsulation stress of the MEMS device.

According to a ninth aspect, a die is provided. The die is bonded to the substrate in any one of the second aspect or the possible implementations of the second aspect.

DESCRIPTION OF EMBODIMENTS

The following describes technical solutions of this application with reference to the accompanying drawings.

The technical solutions in embodiments of this application may be applied to micro-electromechanical system (MEMS) device-level encapsulation. For example, the technical solutions in embodiments of this application may be applied to encapsulation of a microsensor.

For ease of understanding, a MEMS device is used as a microsensor, to briefly describe die attachment of the microsensor.

Die attachment of the microsensor is a process of fastening the microsensor to a printed circuit board (PCB) or a substrate (for example, a ceramic substrate) by using an attachment material, for example, epoxy resin or eutectic solder.

The attachment process of the microsensor mainly includes three steps: dispensing, patching, and curing. A stress (or an encapsulation stress) caused by the attachment process of the microsensor is mainly an interface residual stress generated due to a mismatch between material performance of a substrate, an attachment layer, and an encapsulation substrate, and in particular, a mismatch between a coefficient of thermal expansion (CTE) of the substrate of the microsensor and a coefficient of thermal expansion of the encapsulation substrate. In other words, in the curing process of the attachment material, the interface residual stress generated due to the mismatch between coefficients of thermal expansion of the substrate of the microsensor, the attachment layer, and the encapsulation substrate is a main reason for generating the encapsulation stress.

A quartz glass substrate and an aluminum oxide ceramic substrate are used as an example to briefly describe the generation process of the encapsulation stress.

A coefficient of thermal expansion of quartz glass is 0.5 ppm/K, a coefficient of thermal expansion of silicon is 2.6 ppm/K, and a coefficient of thermal expansion of aluminum oxide is 7.1 ppm/K. A temperature of curing adhesive of the microsensor is usually 150° C.

Figure 1:
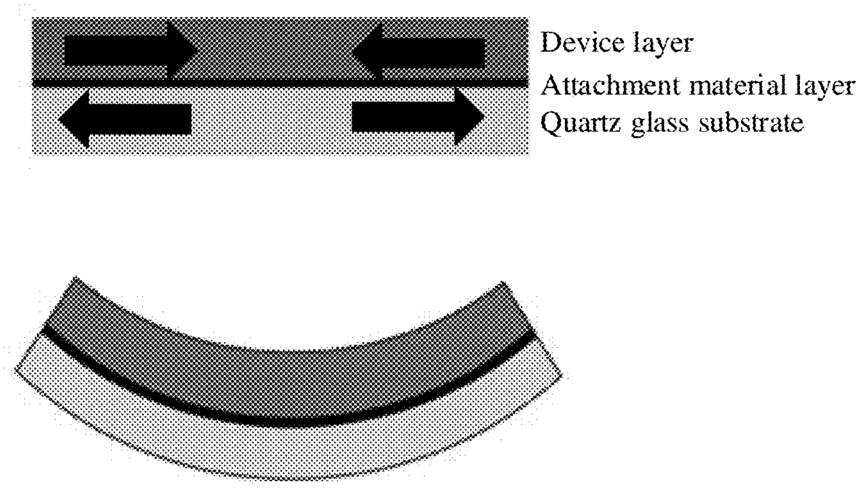
FIG. 1 is an example schematic diagram of a stress and deformation of a three-layer structure when a substrate is quartz glass.

When quartz glass is used as the encapsulation substrate of the microsensor, because the coefficient of thermal expansion of quartz glass is less than the coefficient of thermal expansion of the substrate (silicon) of the microsensor, the encapsulation stress acting on the microsensor is a tensile stress. FIG. 1 is a schematic diagram of a stress and deformation of a three-layer structure when the substrate is quartz glass. As shown in FIG. 1, a center of the microsensor is recessed downwards and four corners are warped upwards. For ease of description in FIG. 1, a substrate made from quartz glass is denoted as a quartz glass substrate.

Figure 2:
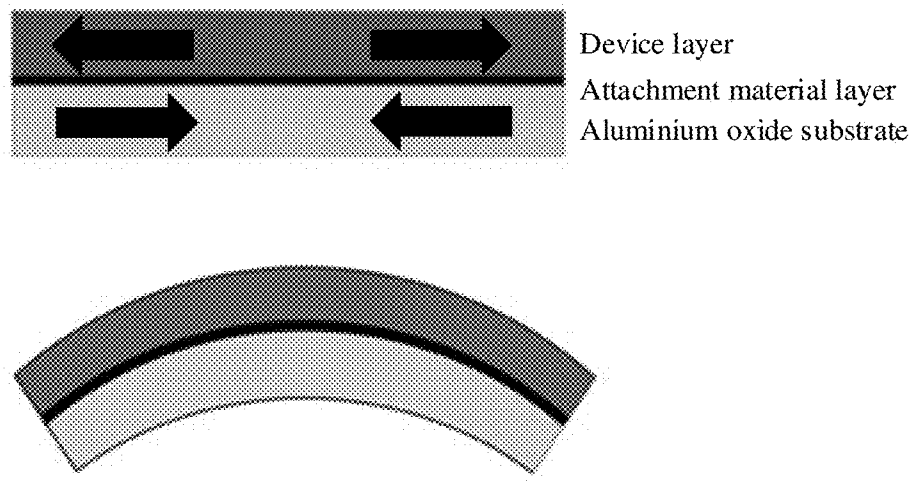
FIG. 2 is an example schematic diagram of a stress and deformation of a three-layer structure when the substrate is aluminum oxide.

When aluminum oxide is used as the encapsulation substrate of the microsensor, because the coefficient of thermal expansion of aluminum oxide is greater than the coefficient of thermal expansion of the substrate (silicon) of the microsensor, the encapsulation stress acting on the microsensor is a compressive stress. FIG. 2 is a schematic diagram of a stress and deformation of a three-layer structure when the substrate is aluminum oxide. As shown in FIG. 2, a center of the microsensor protrudes upwards and four corners are warped downwards. For ease of description in FIG. 2, a substrate made from aluminum oxide is denoted as an aluminum oxide substrate.

It can be seen from FIG. 1 or FIG. 2 that the encapsulation stress of the microsensor that is generated in the attachment process may directly cause warpage and deformation of a micro-structure of the die.

In some cases, the encapsulation stress may also change stiffness of an equivalent structure of a movable structure, which causes an offset of a performance parameter, for example, a frequency, of the microsensor. For example, for some microsensors (for example, a piezoresistive sensor and a pressure sensor) that are sensitive to a stress, a stress generated in the encapsulation process directly affects the device, which directly affects accuracy of a measurement result of the microsensor. For a resonant microsensor, geometrical deformation and an equivalent stiffness change caused by the encapsulation stress change a resonant frequency and a quality factor (Q factor) of the device, which causes a shift of an output signal of the sensor. When the encapsulation stress of the microsensor is too large, the microsensor may crack and delaminate in an interface region, which may damage interconnection of the microsensor, cause failure of the microsensor, or reduce reliability. In addition, the encapsulation stress varies with time, which causes a slow shift of the output signal of the sensor, and further affects long-term stability of the microsensor.

In addition, a MEMS device sensitive to an encapsulation stress is used as an example. The MEMS device sensitive to an encapsulation stress may be used in a scenario imposing a high requirement on temperature stability of the device. For example, a vehicle-mounted inertial measurement unit (IMU) product is used for navigation and positioning of an autonomous driving vehicle. An application scenario of a vehicle-mounted MEMS sensor covers a temperature range of ~40 degrees Celsius (namely, −40° C.) to +105° C., namely, −40° C. to +105° C., for example, a high latitude region, a cold region, or a tropical region in summer. The vehicle-mounted MEMS sensor needs to adapt to rapid temperature changes. For example, when the vehicle-mounted MEMS sensor enters a tunnel with a low temperature in summer, a cooling rate can reach 1° C./min (namely, 1° C. per minute). Due to costs and power consumption limitations, expensive temperature control solutions cannot be used in a vehicle-mounted application scenario. Only low-stress encapsulation is used to make the device insensitive to temperature changes. In addition, specific temperature compensation is used to achieve temperature stability that meets an application requirement. A physical factor behind effect of a temperature on an output of the device is that temperature changes change a stress state of the device. A main source of stress of the MEMS device, for example, a MEMS inertial device, is an encapsulation stress.

An embodiment of this application provides a structure, to effectively reduce an encapsulation stress, and reduce effect of the encapsulation stress on performance of a MEMS device (for example, a microsensor). Further, this can improve long-term stability and reliability of the MEMS device (for example, a microsensor), and adjust the encapsulation stress of the MEMS device (for example, a microsensor) in a controllable manner.

The following describes in detail embodiments of this application with reference to the accompanying drawings.

Figure 3:
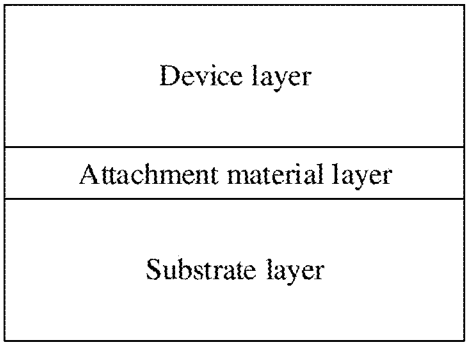
FIG. 3 is an example simplified schematic diagram of an encapsulation structure applicable to an embodiment of this application.

FIG. 3 is a simplified schematic diagram of an encapsulation structure applicable to an embodiment of this application. As shown in FIG. 3, the encapsulation structure includes at least a device layer, an attachment material layer, and a substrate layer.

The device layer, or a MEMS device layer, indicates a position of the MEMS device. The MEMS device may be, for example, a microsensor. Correspondingly, the device layer may be, for example, a microsensor layer.

The MEMS device (for example, the microsensor) mentioned in this embodiment of this application may be any type of MEMS device, and a specific type of the product is not limited. For example, a device (for example, the microsensor) mentioned in this embodiment of this application may be a MEMS accelerometer, a MEMS gyroscope, or another MEMS device sensitive to an encapsulation stress. For ease of understanding, this embodiment of this application is mainly described by using a microsensor as an example.

The attachment material layer indicates a position of an attachment material. The attachment material layer is located between the device layer and the substrate layer. It can be understood that the device may be fastened to the substrate by using the attachment material. The attachment material is, for example, a patch adhesive. It should be understood that any material that can implement an attachment function is applicable to this embodiment of this application.

The substrate layer indicates a position of a substrate. In this embodiment of this application, the substrate may also be referred to as a stress adjustable substrate. The following uniformly uses a substrate for description. In this embodiment of this application, properties of materials in the substrate are adjusted in a controllable manner, to adjust and reduce an encapsulation stress of the MEMS device that is generated due to a mismatch between a coefficient of thermal expansion of the MEMS device and a coefficient of thermal expansion of the substrate in an attachment process, to adjust deformation of the MEMS device.

Optionally, the substrate may have an electrical connection through hole, a metal lead, and a metal pad. The microsensor can be electrically interconnected to the outside by using the substrate in a wire bonding manner.

In this embodiment of this application, the substrate may be designed by using the following solution 1 or solution 2.

Solution 1: The substrate includes a plurality of different materials.

The plurality of different materials include, for example, a first-type material and a second-type material. It should be understood that the first-type material and the second-type material are named for differentiation, and names of the first-type material and the second-type material do not limit the protection scope of embodiments of this application. For example, the second-type material may also be denoted as a proportioning material. The following uniformly uses the second-type material as an example for description.

For example, the MEMS device includes a microsensor.

Optionally, a coefficient of thermal expansion of the first-type material is less than a coefficient of thermal expansion of a base material of the microsensor. For example, the first-type material includes quartz glass. The first-type material (for example, the quartz glass) whose coefficient of thermal expansion is less than a coefficient of thermal expansion of a material of the microsensor is used to compensate for an encapsulation stress, to adjust and reduce an encapsulation stress of the microsensor that is generated due to a mismatch between a coefficient of thermal expansion of a die and a coefficient of thermal expansion of the substrate in an attachment process of the die.

Optionally, a coefficient of thermal expansion of the second-type material is greater than a coefficient of thermal expansion of a base material of the microsensor.

Optionally, the second-type material includes one or more of the following: aluminum oxide, silicon nitride, and aluminum nitride.

For example, the MEMS device is attached to the substrate by using the attachment material, and the materials included in the substrate include the first-type material and the second-type material, so that an encapsulation stress and/or deformation of the MEMS device that are/is generated in an attachment process can be less than a preset threshold. Alternatively, the MEMS device is attached to the substrate by using the attachment material, and the materials included in the substrate include the first-type material and the second-type material, so that an encapsulation stress and/or deformation of the MEMS device that are/is generated in an attachment process can be in a preset range. Alternatively, the MEMS device is attached to the substrate by using the attachment material, and the materials included in the substrate include the first-type material and the second-type material, so that an encapsulation stress and/or deformation of the MEMS device that are/is generated in an attachment process can be controlled. By way of example and not limitation, in some cases, the encapsulation stress of the MEMS device that is generated in the attachment process is 0 or approaches 0. The preset threshold or the preset range may be determined based on an actual requirement during actual application.

That the substrate includes a plurality of different materials may be implemented in at least one manner in the following.

Manner 1: Stack the plurality of different materials, to form the substrate with a multi-layer structure.

In other words, based on the manner 1, the substrate layer is a multi-layer structure formed by stacking the plurality of different materials. In the following, for ease of description, a substrate obtained based on the manner 1 is denoted as a substrate with a multi-layer structure.

For example, the plurality of different materials include the quartz glass and the second-type material. For example, the quartz glass and the second-type material may be alternately stacked in sequence, to form the substrate with a multi-layer structure.

For example, the substrate with a multi-layer structure may be prepared by alternately bonding the first-type material and the second-type material (for example, the quartz glass and the second-type material) in a bonding manner (for example, a die-level or wafer-level bonding manner) in sequence. For example, the second-type material is aluminum oxide. For example, a bonder is used to perform plasma activation bonding on a quartz glass sheet and an aluminum oxide wafer, to form an ion dangling bond between wafers. When the wafers are bonded, a stronger bonding force is formed, to ensure bonding strength.

For another example, the substrate with a multi-layer structure may be prepared by sequentially growing or depositing the first-type material and the second-type material (for example, the quartz glass and the second-type material) in a film growth manner. For example, the second-type material is aluminum oxide. For example, a material (for example, the first-type material) may be used as a base material for processes such as plasma enhanced chemical vapor deposition (PECVD) and metal-organic chemical vapor deposition (MOCVD), to form a heterogeneous material layer, for example, an aluminum oxide layer, through epitaxy growth on a surface of the base material by using the material.

For another example, the substrate with a multi-layer structure may be prepared by combining bonding and film growth.

For another example, the substrate with a multi-layer structure may be prepared by sequentially stacking and attaching the first-type material and the second-type material (for example, the quartz glass and the second-type material) by using the attachment material.

It should be understood that the foregoing several examples are merely examples for description, and any solution in which the plurality of different materials can be stacked to form the substrate with a multi-layer structure is applicable to this embodiment of this application.

When the substrate is a substrate with a multi-layer structure, the encapsulation stress of the device layer (namely, the MEMS device) may be related to one or more of the following: a thickness proportion of each layer in the multi-layer structure, a contact area or an attachment area between layers in the multi-layer structure, and an attachment area between the multi-layer structure and the MEMS device. Therefore, the encapsulation stress of the MEMS device may be controlled by adjusting any one or more of the foregoing. For example, any one or more of the foregoing may be adjusted, to reduce the encapsulation stress, and reduce deformation caused by the encapsulation stress of the MEMS device (for example, the microsensor).

In view of this, the following provides detailed descriptions with reference to FIG. 4 to FIG. 8.

Manner 2: Mix the plurality of different materials based on a preset proportion, to obtain a composite material, where the composite material forms the substrate.

In other words, based on the manner 2, the substrate layer is a composite material layer structure formed by mixing the plurality of different materials. In the following, for ease of description, a substrate obtained based on the manner 2 is denoted as a composite material substrate.

For example, the plurality of different materials include the first-type material and the second-type material. For example, the first-type material and the second-type material (for example, the quartz glass and the second-type material) may be mixed based on different proportions, to form the composite material substrate.

For example, the composite material substrate may be prepared by mixing powder of the first-type material and the second-type material (for example, the quartz glass and the second-type material) and then sintering the powder.

For example, the preset proportion may be a mass proportion of the first-type material in the substrate (namely, the composite material substrate), a mass proportion of the first-type material to the second-type material in the substrate, or a mass proportion of the second-type material in the substrate. The following is described by using an example in which the preset proportion indicates the mass proportion of the first-type material in the substrate.

When the substrate is a composite material substrate, the encapsulation stress of the device layer (namely, the MEMS device) may be related to proportions (for example, mass proportions) of the plurality of different materials in the substrate. Therefore, the proportions of the plurality of different materials in the composite material substrate may be adjusted, to control the encapsulation stress of the device layer (for example, the microsensor layer). For example, the proportions of the plurality of different materials in the composite material substrate may be adjusted, so that an effective coefficient of thermal expansion of the substrate approaches the coefficient of thermal expansion of the substrate of the device (for example, the microsensor). This can further reduce the encapsulation stress, and reduce deformation of the MEMS device (for example, the microsensor) caused by the encapsulation stress.

The preset proportion in the manner 2 may be a proportion determined after a plurality of attempts. For example, after substrates with composite materials in a plurality of different proportions are cured and cooled, a proportion corresponding to smallest deformation of the MEMS device (for example, the microsensor) is selected as the preset proportion.

Figure 9:
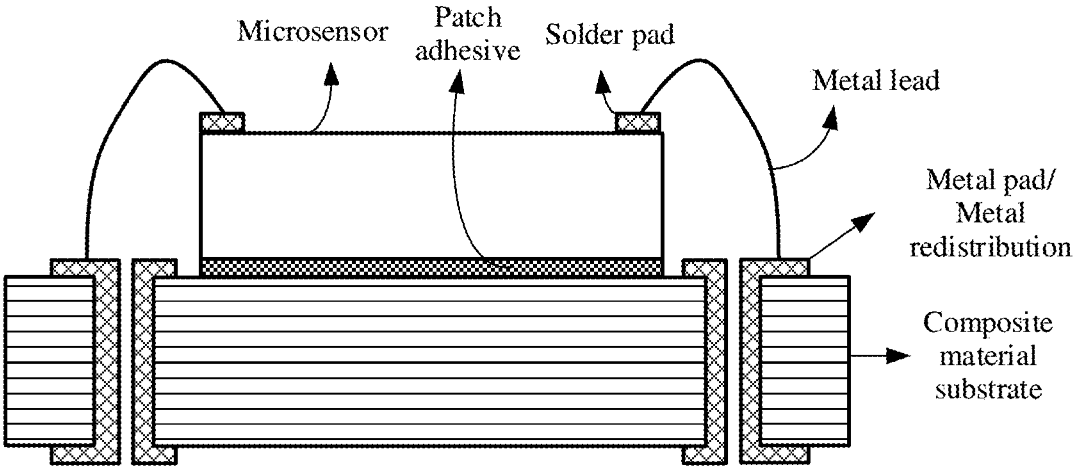
FIG. 9 is an example schematic diagram of a cross section of an encapsulation structure that uses a composite material substrate and that is applicable to an embodiment of this application.

In view of this, the following provides detailed descriptions with reference to FIG. 9.

Based on the solution 1, when the substrate with a multi-layer structure or the composite material substrate is used, the thickness proportion or the mass proportion of the first-type material to the second-type material (for example, the quartz glass and the second-type material) is adjusted, or the attachment area or the contact area between the layer at which the first-type material is located and the layer at which the second-type material is located (for example, the quartz glass layer and the second-type material layer) is adjusted, to adjust properties (for example, a coefficient of thermal expansion, stiffness, and density) of the materials in the substrate in a controllable manner. Therefore, an effective coefficient of thermal expansion of the substrate approaches the coefficient of thermal expansion of the substrate of the microsensor. In a curing process of the attachment material (for example, a patch adhesive), deformation of the substrate and the microsensor that have similar coefficients of thermal expansion is similar, and the interface residual stress approaches 0. Theoretically, the effective coefficient of thermal expansion of the substrate may be adjusted to be the same as the coefficient of thermal expansion of the substrate of the microsensor, and the microsensor may not deform in the curing process of the patch adhesive.

Solution 2: The substrate includes one material.

For example, the MEMS device is a microsensor. Optionally, a coefficient of thermal expansion of the material is less than a coefficient of thermal expansion of a base material of the microsensor.

Optionally, the material may be quartz glass. In other words, the substrate may be quartz glass with a single-layer structure.

When the substrate is a single-layer structure including one material (for example, the quartz glass with a single-layer structure), the encapsulation stress of the device layer (namely, the MEMS device) may be related to one or more of the following: thickness of the substrate (for example, a quartz glass substrate), and an attachment area between the substrate and the MEMS device. Therefore, the encapsulation stress of the device layer (namely, the MEMS device) may be controlled by adjusting any one or more of the foregoing. For example, any one or more of the foregoing may be adjusted, to reduce the encapsulation stress, and reduce deformation caused by the encapsulation stress of the MEMS device (for example, the microsensor).

In view of this, the following provides detailed descriptions with reference to FIG. 10 to FIG. 13.

Based on the solution 2, when the quartz glass material is used, thickness of the quartz glass substrate may be changed, to adjust stiffness of the substrate in a controllable manner. As the thickness of the quartz glass substrate increases, maximum deformation (encapsulation stress) of a MEMS device die may gradually decrease. In addition, an attachment area (for example, an area of a patch adhesive) between the quartz glass substrate and the MEMS device may be changed. As the attachment area (for example, an area of a patch adhesive) decreases, maximum deformation (encapsulation stress) of the MEMS device die may gradually decrease. Therefore, the thickness of the quartz glass substrate and/or the attachment area (for example, an area of a patch adhesive) between the quartz glass substrate and the MEMS device are/is adjusted, to adjust the encapsulation stress of the MEMS device die in a controllable manner.

The foregoing briefly describes two solutions. The following describes in detail a possible encapsulation structure applicable to embodiments of this application by using an example in which the MEMS device is a microsensor and the attachment material is a patch adhesive.

It should be understood that a specific material of the microsensor is not limited in this embodiment of this application. By way of example and not limitation, the base material of the microsensor may be any one of the following materials: monocrystalline silicon, silicon carbide, diamond, and gallium nitride.

It should further be understood that a specific material of the patch adhesive is not limited in this embodiment of this application. By way of example and not limitation, the patch adhesive may be any one of the following materials: epoxy resin, a resin alternative, metal solder, and glass powder.

Figure 4:
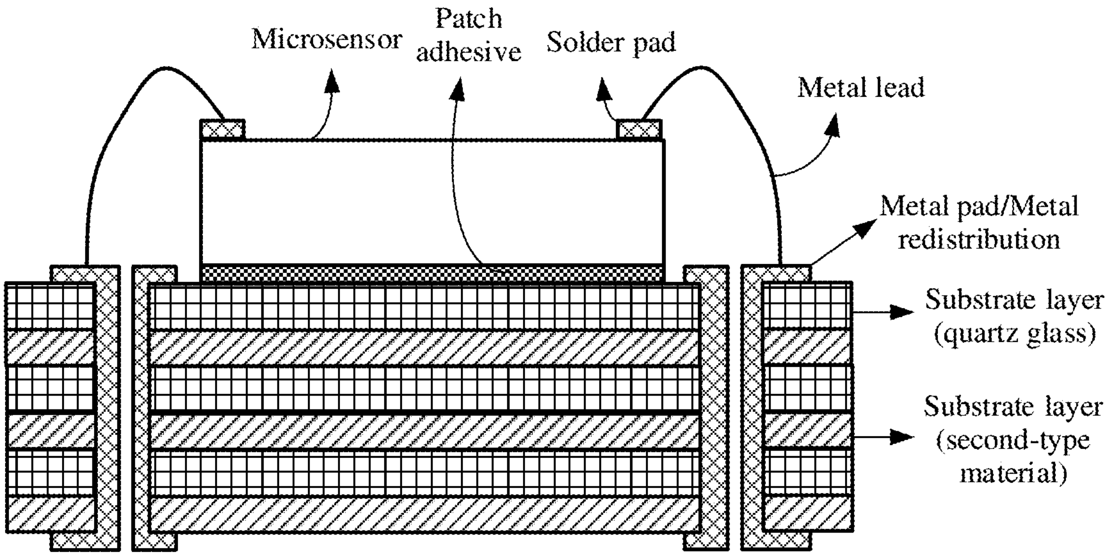
FIG. 4 is an example schematic diagram of a cross section of an encapsulation structure that uses a substrate with a multi-layer structure and that is applicable to an embodiment of this application.
Figure 5:
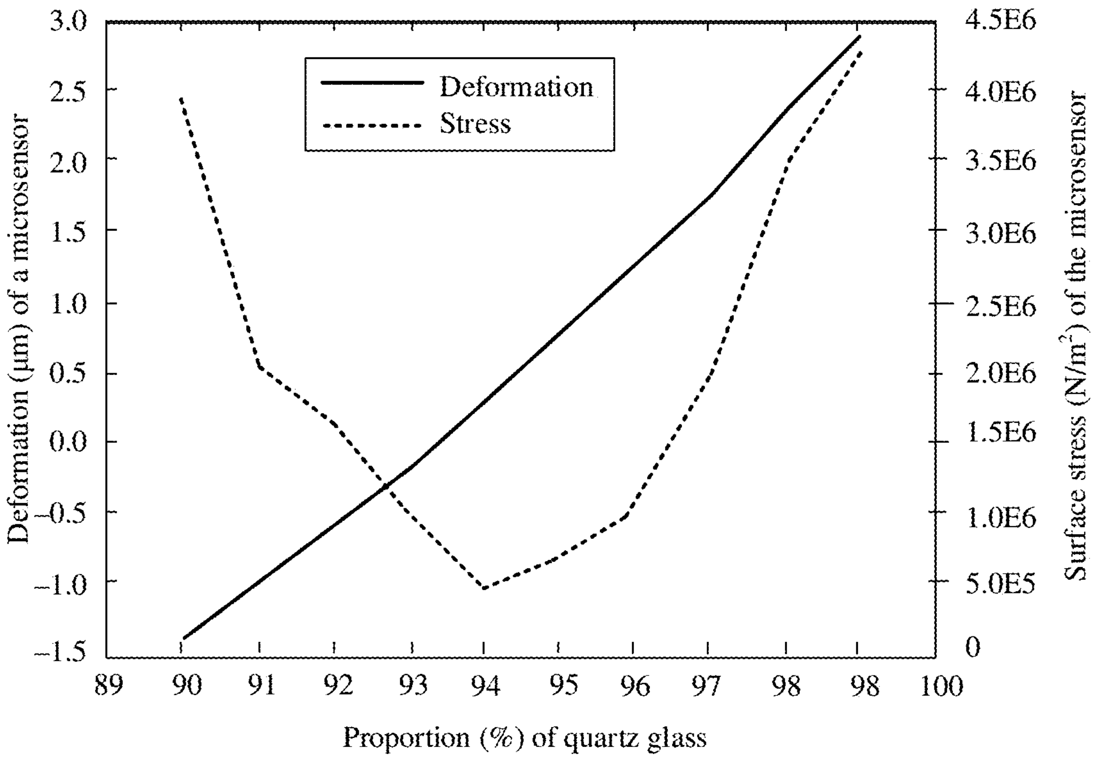
FIG. 5 is an example schematic diagram of a simulation result of a relationship between deformation of a microsensor and a proportion of quartz glass in a substrate with a multi-layer structure.
Figure 6:
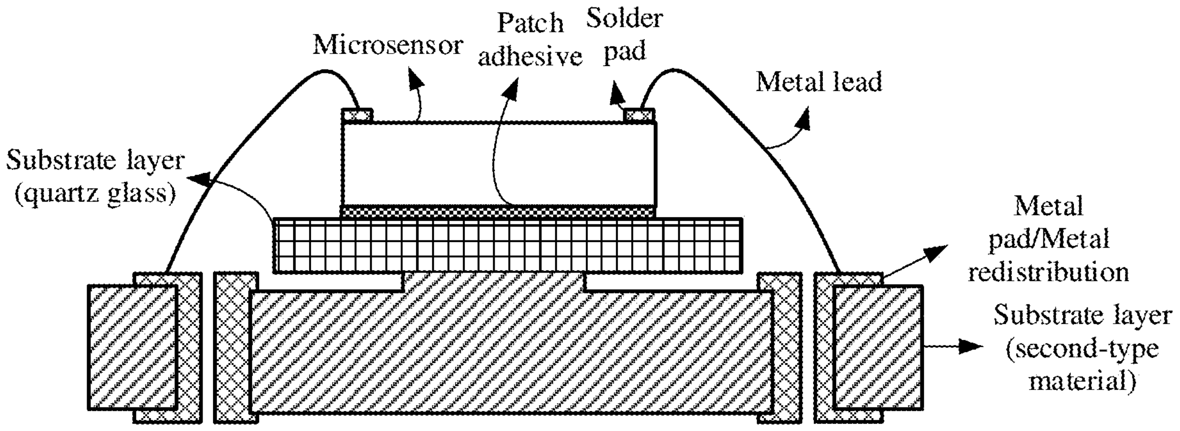
FIG. 6 is an example schematic diagram of a cross section of an encapsulation structure that uses a substrate with a multi-layer structure and that is applicable to another embodiment of this application.
Figure 7:
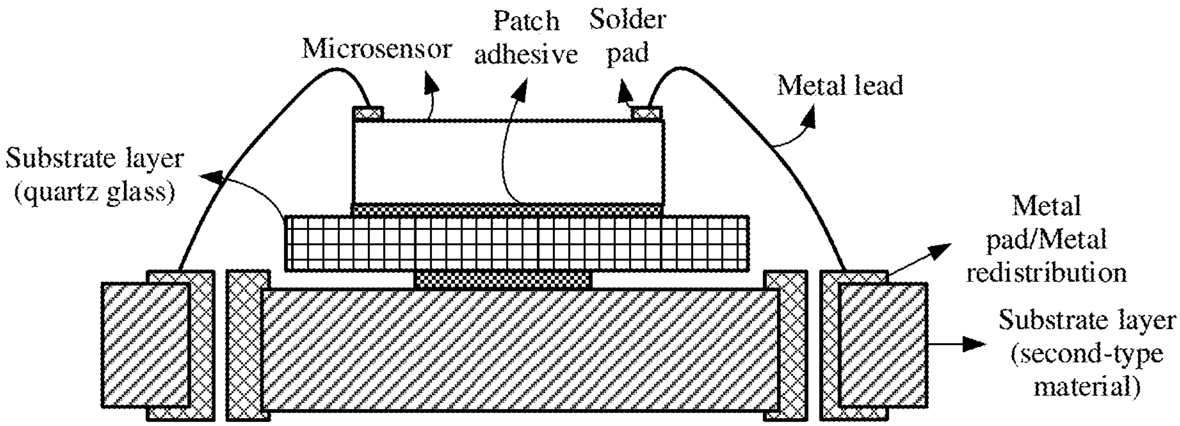
FIG. 7 is an example schematic diagram of a cross section of an encapsulation structure that uses a substrate with a multi-layer structure and that is applicable to another embodiment of this application.

FIG. 4 to FIG. 9 show possible encapsulation structures applicable to the solution 1. The structure shown in FIG. 4, FIG. 6, and FIG. 7 is applicable to the manner 1 in the solution 1, and the structure shown in FIG. 9 is applicable to the manner 2 in the solution 1. The following describes the structures in detail.

FIG. 4 is a schematic diagram of a cross section of an encapsulation structure that uses a substrate with a multi-layer structure and that is applicable to an embodiment of this application.

As shown in FIG. 4, the encapsulation structure includes a multi-layer structure formed by stacking the microsensor, the patch adhesive, and the substrate from top to bottom. For example, the encapsulation structure may further include a solder pad, a metal lead, a metal pad, or metal redistribution. The solder pad on an edge of an upper surface of the microsensor can be connected to the metal pad on the substrate through the metal lead. The metal pad or metal redistribution can be electrically interconnected with the outside through an electrical connection through hole of the substrate.

In the structure shown in FIG. 4, the substrate layer may be formed by alternately stacking the quartz glass and the second-type material in sequence. In other words, the plurality of layers of materials including the quartz glass and the second-type material can be used as the substrate with a multi-layer structure.

The plurality of layers of materials may be formed by stacking the quartz glass and the second-type material based on a specific period. For example, as shown in FIG. 4, the plurality of layers of materials may include six layers of single-layer materials. In other words, each layer may include one material, adjacent two layers are formed by stacking the quartz glass and the second-type material based on a specific thickness proportion, and a quantity of periods is 3.

The substrate with a multi-layer structure may be a two-layer structure, or a structure with more than two layers. For example, in the structure shown in FIG. 4, the substrate with a multi-layer structure may be a six-layer structure formed by stacking the quartz glass and the second-type material in sequence.

As described above, when the substrate is a multi-layer structure, the encapsulation stress of the microsensor may be related to one or more of the following: a thickness proportion of each layer in the multi-layer structure, a contact area or an attachment area between layers in the multi-layer structure, and an attachment area between the multi-layer structure and the microsensor.

For example, the thickness proportion of each layer in the multi-layer structure may be adjusted, that is, the thickness proportion of each layer of material in the plurality of layers of materials may be adjusted, as shown in FIG. 4.

When the thickness proportion of the quartz glass layer to the second-type material layer is changed, deformation caused by the stress of the microsensor may change accordingly. Therefore, thickness proportions of two adjacent quartz glass layers to the second-type material layer may be continuously changed, to determine a thickness proportion of the quartz glass to the second-type material when deformation of the microsensor is the smallest. Therefore, this can implement low-stress encapsulation of the microsensor.

In a possible implementation, total thickness of the substrate with a multi-layer structure may remain unchanged, two adjacent layers are formed by stacking the quartz glass and the second-type material based on a specific thickness proportion, and thickness of the two adjacent layers (the quartz glass and the second-type material) is total thickness of the substrate with a multi-layer structure divided by a quantity of periods. The substrate with a multi-layer structure is prepared by continuously changing the thickness proportion of the quartz glass to the second-type material in two adjacent layers. For example, substrates with a multi-layer structure are separately prepared based on thickness proportions of the quartz glass to the second-type material in two adjacent layers that are 9:1, 8:2, 7:3, 6:4, 5:5, and the like. The microsensor is separately attached to the substrates with a multi-layer structure that have different thickness proportions by using the patch adhesive, and deformation of the microsensor is measured after curing and cooling. For example, the thickness proportion, of the quartz glass to the second-type material, corresponding to smallest deformation of the microsensor may be selected as an optimal thickness proportion, namely, the thickness proportion of the substrate with a multi-layer structure.

Therefore, when the plurality of layers of materials are used as the substrate with a multi-layer structure, the thickness proportion of the quartz glass to the second-type material in the plurality of layers of materials are adjusted, to adjust properties (for example, a coefficient of thermal expansion, stiffness, and density) of the materials in the substrate in a controllable manner. Therefore, the effective coefficient of thermal expansion of the substrate approaches the coefficient of thermal expansion of the substrate of the microsensor. In the curing process of the patch adhesive, because the substrate with a multi-layer structure and the microsensor have similar coefficients of thermal expansion, deformation of the substrate with a multi-layer structure and the microsensor is similar, and the interface residual stress caused by attachment of the patch adhesive approaches 0. A decrease in the interface residual stress can improve reliability and long-term stability of microsensor.

FIG. 5 is a schematic diagram of a simulation result of a relationship between deformation of the microsensor and the proportion of the quartz glass in the substrate with a multi-layer structure.

For example, it is assumed that total thickness of the substrate with a multi-layer structure is 1 millimeter (mm), and the substrate with a multi-layer structure uses a six-layer structure including the quartz glass and the second-type material aluminum oxide. The microsensor is made from silicon oxide with thickness of 0.5 mm, and the patch adhesive is made from epoxy resin with thickness of 0.03 mm.

In the schematic diagram shown in FIG. 5, a horizontal axis is the proportion of the quartz glass, and indicates the thickness proportion of the quartz glass in the plurality of layers of materials included in the substrate with a multi-layer structure, and a unit is percentage (%). Vertical axes indicate a surface stress and deformation of the microsensor. A unit of the surface stress of the microsensor is N/square meter ($N/m^2$), and a unit of deformation of the microsensor is micrometer (μm). It can be seen from FIG. 5 that, as the proportion of the quartz glass increases, maximum deformation of the microsensor device changes from negative to positive, that is, first decreases to 0, and then continues to increase. It can be understood that the encapsulation stress of the microsensor device gradually changes from a compressive stress to a tensile stress as the proportion of the quartz glass changes, and the encapsulation stress can be gradually adjusted. Therefore, the proportion (namely, the thickness proportion of the quartz glass in the plurality of layers of materials included in the substrate with a multi-layer structure) of the quartz glass may be adjusted, to adjust the encapsulation stress of the microsensor device in a controllable manner. In the example shown in FIG. 5, the proportion (namely, the thickness proportion of the quartz glass in the plurality of layers of materials included in the substrate with a multi-layer structure) of the quartz glass is in a range from 93% to 94%, maximum deformation of the microsensor device approaches 0, to implement encapsulation without deformation.

It should be understood that FIG. 5 is merely a schematic diagram of a possible simulation result, and does not limit the protection scope of embodiments of this application.

It should further be understood that the structure shown in FIG. 4 is merely an example for description, and any variation of the structure shown in FIG. 4 falls within the protection scope of embodiments of this application. For example, the substrate with a multi-layer structure may further include more layers of material. For another example, the quantity of periods may alternatively be another value.

It should further be understood that, in the substrate with a multi-layer structure, the thickness proportion of the quartz glass layer to the second-type material layer may vary with the structure of the microsensor. Therefore, thickness proportions of the quartz glass layer to the second-type material layer may be continuously changed, to determine an optimal proportion of the quartz glass layer to the second-type material layer in the substrate with a multi-layer structure when deformation of the microsensor layer is the smallest.

In the structure shown in FIG. 4, when the substrate with a multi-layer structure is used, the thickness proportion of the quartz glass to the second-type material in the substrate with a multi-layer structure may be adjusted, to adjust the encapsulation stress of the microsensor, and then adjust deformation of the microsensor. In some cases, deformation of the microsensor may be adjusted to 0.

FIG. 6 is a schematic diagram of a cross section of an encapsulation structure that uses a substrate with a multi-layer structure and that is applicable to another embodiment of this application.

As shown in FIG. 6, the encapsulation structure includes a multi-layer structure formed by stacking the microsensor, the patch adhesive, and the substrate from top to bottom. For example, the encapsulation structure may further include a solder pad, a metal lead, a metal pad, or metal redistribution. For details, refer to descriptions in FIG. 4.

In the structure shown in FIG. 6, the substrate layer may be a double-layer structure including a quartz glass material and a second-type material, for example, the substrate layer (quartz glass) and the substrate layer (second-type material) in FIG. 6.

As described above, when the substrate is a multi-layer structure, the encapsulation stress of the microsensor may be related to one or more of the following: a thickness proportion of each layer in the multi-layer structure, a contact area or an attachment area between layers in the multi-layer structure, and an attachment area between the multi-layer structure and the microsensor.

For example, a contact area between layers in the multi-layer structure may be adjusted, that is, an area in which the layers in the multi-layer structure contact with each other may be adjusted, as shown in FIG. 6. For differentiation, a layer corresponding to the quartz glass is denoted as a quartz glass layer, and a layer corresponding to the second-type material is denoted as a second-type material layer.

When the contact area between the quartz glass layer and the second-type material layer is changed, deformation caused by the stress of the microsensor may change accordingly. Therefore, the contact area between the quartz glass layer and the second-type material layer may be changed, to determine a contact area between the quartz glass layer and the second-type material layer when deformation of the microsensor is the smallest. Therefore, this can implement low-stress encapsulation of the microsensor.

In a possible implementation, substrates with a multi-layer structure that have different contact areas are prepared in a bonding manner. Specifically, for example, when the substrate with a multi-layer structure is prepared by using the quartz glass and the second-type material in a bonding manner, a part of the second-type material may be etched through patterned lithography and etching, to form a boss structure with a specific area. The contact area between the quartz glass layer and the second-type material layer can be changed after bonding. In the structure shown in FIG. 6, the contact area between the quartz glass layer and the second-type material layer can be changed by changing a size of a boss.

For example, substrates with a multi-layer structure are separately prepared based on contact areas between the quartz glass layer and the second-type material layer that are ½ of an area of the quartz glass layer, ⅓ of the area of the quartz glass layer, ¼ of the area of the quartz glass layer, ⅕ of the area of the quartz glass layer, and the like. The microsensor is separately attached to the substrates with a multi-layer structure that have different contact areas by using the patch adhesive, and deformation of the microsensor is measured after curing and cooling. For example, the contact area, between the quartz glass layer and the second-type material layer, corresponding to smallest deformation of the microsensor may be selected as an optimal contact area, namely, the contact area between the quartz glass layer and the second-type material layer in the substrate with a multi-layer structure.

Figure 8:
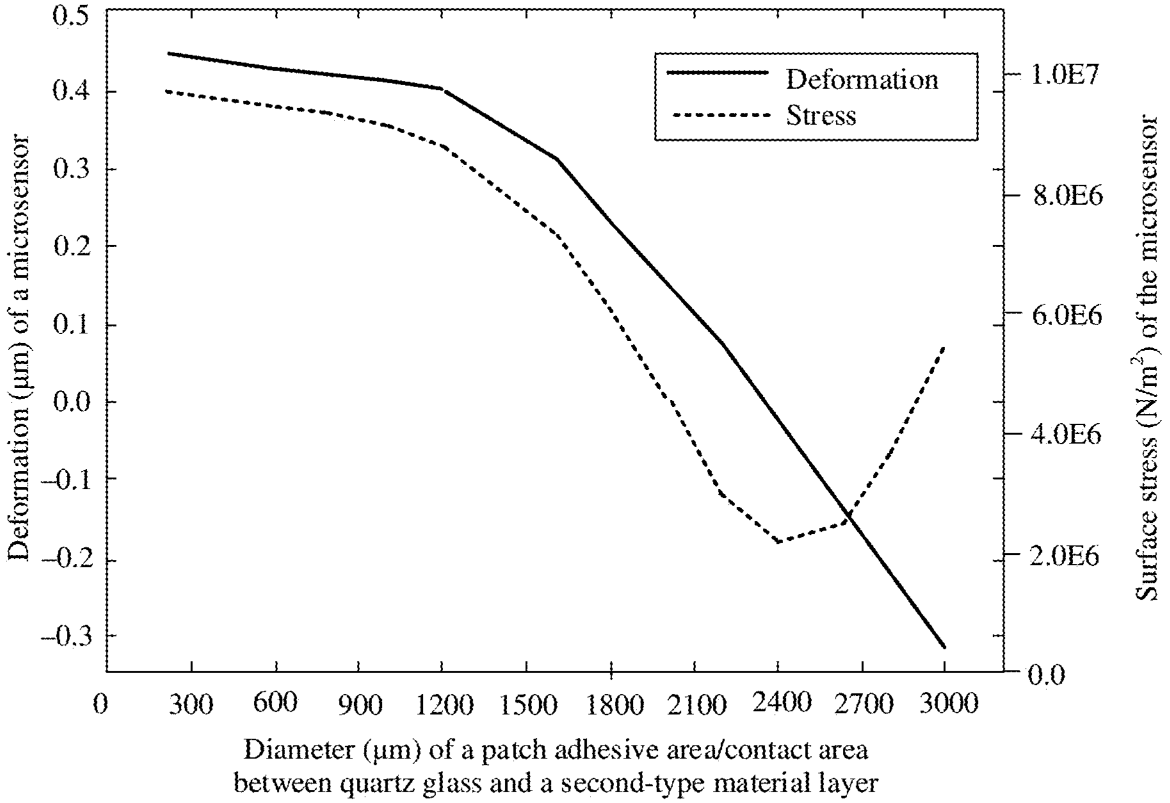
FIG. 8 is an example schematic diagram of a simulation result of deformation and a stress of a microsensor when patch adhesive areas or contact areas between a quartz glass layer and a second-type material layer are different.

The following describes, with reference to FIG. 8, a simulation result of deformation and a stress of the microsensor when the contact areas between the quartz glass layer and the second-type material layer are different.

Therefore, when the plurality of layers of materials are used as the substrate with a multi-layer structure, the stress and deformation of the microsensor can be adjusted in a controllable manner by adjusting the contact area between the layers in the multi-layer structure.

It should be understood that the structure shown in FIG. 6 is merely an example for description, and any variation of the structure shown in FIG. 6 falls within the protection scope of embodiments of this application. For example, a plurality of boss structures or a structure in another form may further be formed between the quartz glass layer and the second-type material layer.

It should further be understood that, in the substrate with a multi-layer structure, the contact area between the quartz glass layer and the second-type material layer may vary with the structure of the microsensor. Therefore, the contact areas between the quartz glass layer and the second-type material layer may be continuously changed, to determine an optimal contact area between the quartz glass layer and the second-type material layer in the substrate with a multi-layer structure when deformation of the microsensor layer is the smallest.

In the structure shown in FIG. 6, when the substrate with a multi-layer structure is used, the contact area between the quartz glass layer and the second-type material layer in the substrate with a multi-layer structure may be adjusted, to adjust the encapsulation stress of the microsensor, and then adjust deformation of the microsensor. In some cases, deformation of the microsensor may be adjusted to 0.

FIG. 7 is a schematic diagram of a cross section of an encapsulation structure that uses a substrate with a multi-layer structure and that is applicable to another embodiment of this application.

As shown in FIG. 7, the encapsulation structure includes a multi-layer structure formed by stacking the microsensor, the patch adhesive, and the substrate from top to bottom. For example, the encapsulation structure may further include a solder pad, a metal lead, a metal pad, or metal redistribution. For details, refer to descriptions in FIG. 4.

In the structure shown in FIG. 7, the substrate layer includes a double-layer structure including a quartz glass material and a second-type material, for example, the substrate layer (quartz glass) and the substrate layer (second-type material) in FIG. 7. A difference between the structure shown in FIG. 6 and the structure shown in FIG. 7 lies in that the quartz glass layer is attached to the second-type material layer by using an attachment material.

As described above, when the substrate is a multi-layer structure, the encapsulation stress of the microsensor may be related to one or more of the following: a thickness proportion of each layer in the multi-layer structure, a contact area or an attachment area between layers in the multi-layer structure, and an attachment area between the multi-layer structure and the microsensor.

For example, an attachment area between layers in the multi-layer structure is adjusted, that is, an area of an attachment material between the layers in the multi-layer structure is adjusted, as shown in FIG. 7.

When the attachment area between the quartz glass layer and the second-type material layer is changed, deformation caused by the stress of the microsensor may change accordingly. Therefore, the attachment area between the quartz glass layer and the second-type material layer may be changed, to determine an attachment area between the quartz glass layer and the second-type material layer when deformation of the microsensor is the smallest. Therefore, this can implement low-stress encapsulation of the microsensor.

In a possible implementation, substrates with a multi-layer structure that have different attachment areas are prepared through attachment by using a patch adhesive. Specifically, for example, when the substrate with a multi-layer structure is prepared by using the quartz glass and the second-type material through attachment by using the patch adhesive, a patch adhesive area between the quartz glass layer and the second-type material layer may be continuously changed, to change the attachment area between the quartz glass layer and the second-type material layer.

For example, substrates with a multi-layer structure are separately prepared based on attachment areas (namely, patch adhesive areas between the quartz glass layer and the second-type material layer) between the quartz glass layer and the second-type material layer that are ½ of an area of the quartz glass layer, ⅓ of the area of the quartz glass layer, ¼ of the area of the quartz glass layer, ⅕ of the area of the quartz glass layer, and the like. The microsensor is separately attached to the substrates with a multi-layer structure that have different attachment areas by using the patch adhesive, and deformation of the microsensor is measured after curing and cooling. For example, when attachment strength is ensured, an attachment area, between the quartz glass layer and the second-type material layer, corresponding to smallest deformation of the microsensor may be selected as an optimal attachment area.

Therefore, when the plurality of layers of materials are used as the substrate with a multi-layer structure, the stress and deformation of the microsensor can be adjusted in a controllable manner by adjusting the attachment area, for example, the patch adhesive area between the quartz glass layer and the second-type material layer, between the layers in the multi-layer structure.

FIG. 8 is a schematic diagram of a simulation result of deformation and a stress of a microsensor when patch adhesive areas or contact areas between a quartz glass layer and a second-type material layer are different.

For example, it is assumed that total thickness and sizes of the microsensor and the substrate with a multi-layer structure are determined. For example, the microsensor uses monocrystalline silicon, and the size of the microsensor is 3×4×0.5. A size of the quartz glass layer is 5×4×0.5, and a size of the second-type material layer is 6×4×0.5. Units of the size of the microsensor and the size of the substrate with a multi-layer structure are all described by using mm as an example. The patch adhesive is made from epoxy resin in a central attachment manner, and an attachment area is round-shaped.

In the schematic diagram shown in FIG. 8, a horizontal axis indicates a diameter of the patch adhesive area or the contact area between the quartz glass layer and the second-type material layer, and a unit of the diameter is μm. Vertical axes indicate a surface stress and deformation of the microsensor. A unit of the surface stress of the microsensor is $N/m^2$, and a unit of deformation of the microsensor is μm. It can be seen from FIG. 8 that as the patch adhesive area between the quartz glass layer and the second-type material layer increases, both deformation and the stress of the microsensor device first decrease and then increase. When the diameter of the patch adhesive area between the quartz glass layer and the second-type material layer is about 2400 μm, deformation of the microsensor device may be 0, and the surface stress of the microsensor device is minimized. This implements encapsulation almost without deformation.

It should be understood that FIG. 8 is merely a schematic diagram of a possible simulation result, and does not limit the protection scope of embodiments of this application.

It should further be understood that the structure shown in FIG. 7 is merely an example for description, and any variation of the structure shown in FIG. 7 falls within the protection scope of embodiments of this application. For example, the quartz glass layer and the second-type material layer in the substrate with a multi-layer structure may be attached by using a plurality of spaced patch adhesives. For another example, the quartz glass layer and the second-type material layer in the substrate with a multi-layer structure may be attached in a non-center attachment manner by using a patch adhesive.

It should further be understood that, in the substrate with a multi-layer structure, the attachment area between the quartz glass layer and the second-type material layer may vary with the structure of the microsensor. Therefore, the attachment areas between the quartz glass layer and the second-type material layer may be continuously changed, to determine an optimal attachment area between the quartz glass layer and the second-type material layer in the substrate with a multi-layer structure when deformation of the microsensor layer is the smallest.

In the structure shown in FIG. 7, when the substrate with a multi-layer structure is used, the patch adhesive area between the quartz glass layer and the second-type material layer in the substrate with a multi-layer structure may be adjusted, to adjust the encapsulation stress of the microsensor, and then adjust deformation of the microsensor. In some cases, deformation of the microsensor may be adjusted to 0. In addition, the patch adhesive area between the quartz glass layer and the second-type material layer in the substrate with a multi-layer structure may be adjusted, to determine a suitable substrate, and reduce difficulty of controlling proportions in a multi-layer structure preparation process. The method is simple to process, and effectively reduces costs.

The foregoing describes adjustment of the thickness proportion of each layer in the multi-layer structure with reference to FIG. 4, describes adjustment of the contact area between the layers in the multi-layer structure with reference to FIG. 6, and describes the attachment area between the layers in the multi-layer structure with reference to FIG. 7. It should be understood that, in this embodiment of this application, both the thickness proportion of each layer in the multi-layer structure and the contact area or the attachment area between the layers in the multi-layer structure may be adjusted. This can further reduce the encapsulation stress of the microsensor.

FIG. 9 is a schematic diagram of a cross section of an encapsulation structure that uses a composite material substrate and that is applicable to an embodiment of this application.

As shown in FIG. 9, the encapsulation structure includes a multi-layer structure formed by stacking the microsensor, the patch adhesive, and the substrate from top to bottom. For example, the encapsulation structure may further include a solder pad, a metal lead, a metal pad, or metal redistribution. For details, refer to descriptions in FIG. 4.

In the structure shown in FIG. 9, the substrate layer may include a composite material obtained through mixing quartz glass and a second-type material based on a specific proportion. In other words, the composite material obtained through mixing the quartz glass and the second-type material based on the specific proportion forms the composite material substrate.

As described above, when the substrate is made from a composite material, an encapsulation stress of the microsensor layer may be related to proportions of a plurality of different materials in the composite material.

When a proportion of the quartz glass to the second-type material is changed, deformation caused by the stress of the microsensor may change accordingly. Therefore, the proportion of the quartz glass to the second-type material may be changed, to determine a proportion of the quartz glass to the second-type material when deformation of the microsensor is the smallest. Therefore, this can implement low-stress encapsulation of the microsensor.

In a possible implementation, powder of the quartz glass and the second-type material are mixed based on different mass proportions and then sintered, to prepare composite material substrates with different proportions.

For example, a total mass of the composite material substrate may remain unchanged. The composite substrates are prepared based on mass proportions of the quartz glass that are 60%, 70%, 80%, 90%, and the like. Specifically, for example, the second-type material is aluminum oxide. The quartz glass powder whose mass accounts for 60% of the total mass of the composite material substrate and aluminum oxide powder whose mass accounts for 40% of the total mass of the composite material substrate are mixed and sintered, to form a composite material substrate whose mass proportion of the quartz glass is 60%. The proportion of the quartz glass and aluminum oxide in the total mass of composite material substrate is changed, to obtain, in the same manner, composite material substrates whose mass proportions of the quartz glass are different, for example, 70%, 80%, and 90%. The microsensor is separately attached to the composite material substrates with different mass proportions of the quartz glass by using a patch adhesive. Deformation of the microsensor is measured after curing and cooling of the composite material substrates with different proportions. For example, the mass proportion of the quartz glass corresponding to smallest deformation of the microsensor may be selected as a mass proportion of the quartz glass in the final composite material substrate. By way of example and not limitation, in some cases, when the quartz glass and aluminum oxide ceramic are used as two materials for adjusting a stress, the mass proportion of the quartz glass is in a range from 85% to 98%, to obtain a low encapsulation stress. For example, the mass proportion of the quartz glass is 94%.

It should be understood that the structure shown in FIG. 9 is merely an example for description, and any variation of the structure shown in FIG. 9 falls within the protection scope of embodiments of this application.

It should further be understood that, in the composite material substrate, the proportion of the quartz glass to the second-type material may vary with the structure of the microsensor. Therefore, proportions of the quartz glass to the second-type material may be continuously changed, to determine an optimal proportion of the quartz glass to the second-type material in the composite material substrate when deformation of the microsensor layer is the smallest.

In the structure shown in FIG. 9, when the composite material substrate is used, the proportion of the quartz glass to the second-type material in the composite material substrate may be adjusted, to adjust the proportion (for example, the mass proportion) of the quartz glass in the composite material substrate, adjust the encapsulation stress of the microsensor, and then adjust deformation of the microsensor. In some cases, deformation of the microsensor may be adjusted to 0. In addition, the quartz glass and the second-type material in the composite material substrate are distributed more evenly, to more accurately control deformation of the microsensor by using the composite material substrate.

The foregoing describes several possible structures application to the solution 1 by using examples with reference to FIG. 4 to FIG. 9. It should be understood that the structures are merely examples for description, and any variation of the several structures falls within the protection scope of embodiments of this application.

The following describes a possible encapsulation structure applicable to the solution 2 with reference to FIG. 10 to FIG. 13.

Figure 10:
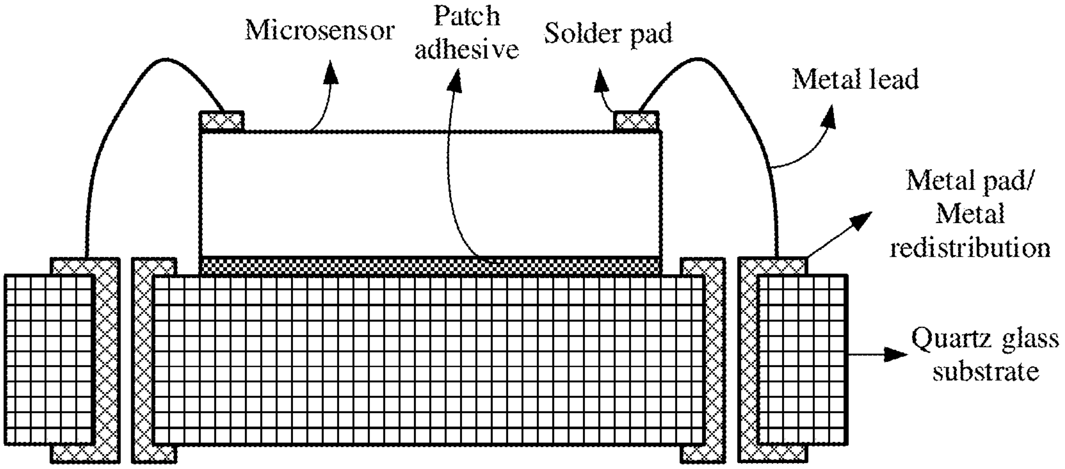
FIG. 10 is an example schematic diagram of a cross section of an encapsulation structure that uses a quartz glass substrate and that is applicable to an embodiment of this application.

FIG. 10 is a schematic diagram of a cross section of an encapsulation structure that uses a quartz glass substrate and that is applicable to an embodiment of this application.

As shown in FIG. 10, the encapsulation structure includes a multi-layer structure formed by stacking the microsensor, the patch adhesive, and the substrate from top to bottom. For example, the encapsulation structure may further include a solder pad, a metal lead, a metal pad, or metal redistribution. For details, refer to descriptions in FIG. 4.

In the structure shown in FIG. 10, the substrate layer may include a single-layer quartz glass. For ease of description, a substrate made from quartz glass is denoted as a quartz glass substrate.

As described above, an encapsulation stress of the microsensor layer may be related to one or more of the following: thickness of the quartz glass substrate, and an attachment area between the quartz glass substrate and the microsensor layer.

For example, the thickness of the quartz glass substrate may be adjusted.

When the thickness (or a thickness range) of the quartz glass substrate is changed, deformation caused by the stress of the microsensor changes accordingly. Therefore, the thickness (or the thickness range) of the quartz glass substrate may be continuously changed, to determine thickness of the quartz glass substrate when deformation of the microsensor is the smallest. Therefore, this can implement low-stress encapsulation of the microsensor.

For example, the microsensor is sequentially attached, by using a patch adhesive, to quartz glass substrates whose thickness difference between each other is 300 μm. For example, the microsensor is separately attached, by using a patch adhesive, to the quartz glass substrates whose thickness difference between each other is 300 μm, 600 μm, . . . , and 3000 μm. Deformation of the microsensor is measured after curing and cooling. For example, the thickness of the quartz glass substrate corresponding to smallest deformation of the microsensor may be selected as optimal thickness, namely, the thickness of the final quartz glass substrate.

Figure 11:
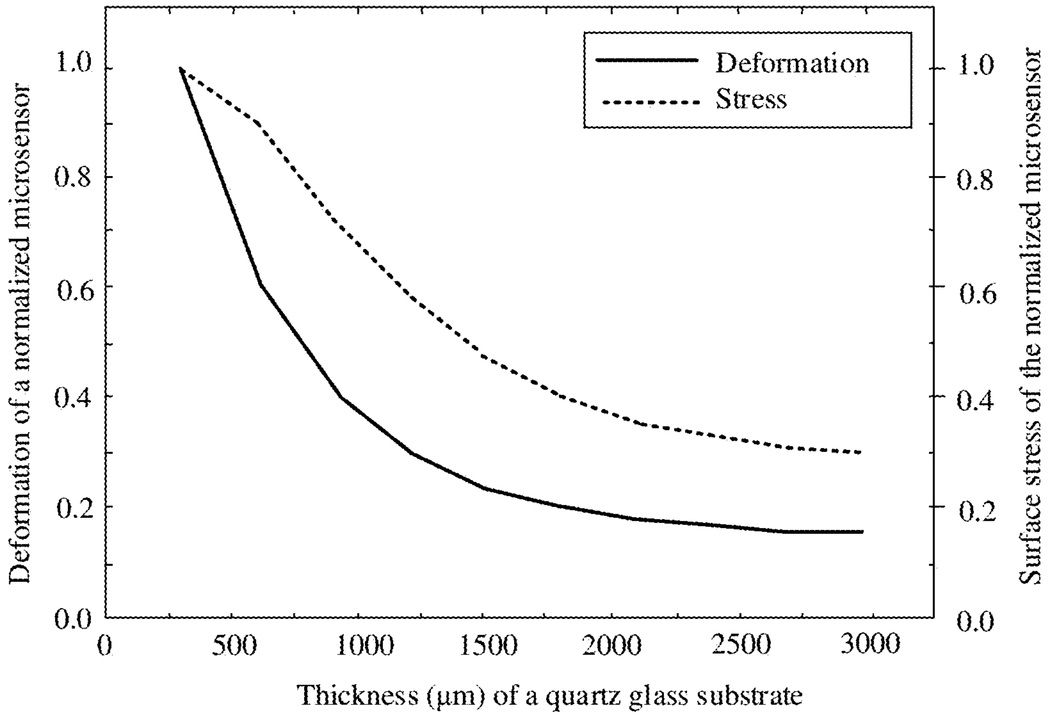
FIG. 11 is an example schematic diagram of a simulation result of a relationship between deformation of a normalized microsensor and thickness of a quartz glass substrate.

FIG. 11 is a schematic diagram of a simulation result of a relationship between deformation of a normalized microsensor and the thickness of the quartz glass substrate.

In the schematic diagram shown in FIG. 11, a horizontal axis is the thickness of the quartz glass substrate, and a unit is μm. Vertical axes are separately a surface stress of the normalized microsensor and deformation of the microsensor. It can be seen from FIG. 11 that as the thickness of the quartz glass substrate increases, maximum deformation and the encapsulation stress of the microsensor device gradually decrease, and gradually converge to a specific minimum value. When deformation caused by the stress of the microsensor device is required to be in a range (for example, less than 0.1 μm), the thickness of the quartz glass substrate corresponding to deformation less than 0.1 μm may be selected as optimal thickness. Therefore, this can implement low-stress encapsulation of the microsensor.

It should be understood that FIG. 11 is merely a schematic diagram of a possible simulation result, and does not limit the protection scope of embodiments of this application.

It should further be understood that the structure shown in FIG. 10 is merely an example for description, and any variation of the structure shown in FIG. 10 falls within the protection scope of embodiments of this application.

It should further be understood that, in the quartz glass substrate, the thickness of the quartz glass substrate may vary with the structure of the microsensor. Therefore, the thickness of the quartz glass substrate may be continuously changed, to determine optimal thickness of the quartz glass substrate when deformation of the microsensor layer is the smallest.

In the structure shown in FIG. 10, the thickness of the quartz glass substrate is adjusted, to adjust the encapsulation stress of the microsensor. Therefore, the encapsulation stress of the microsensor may be adjusted in a controllable manner.

Figure 12:
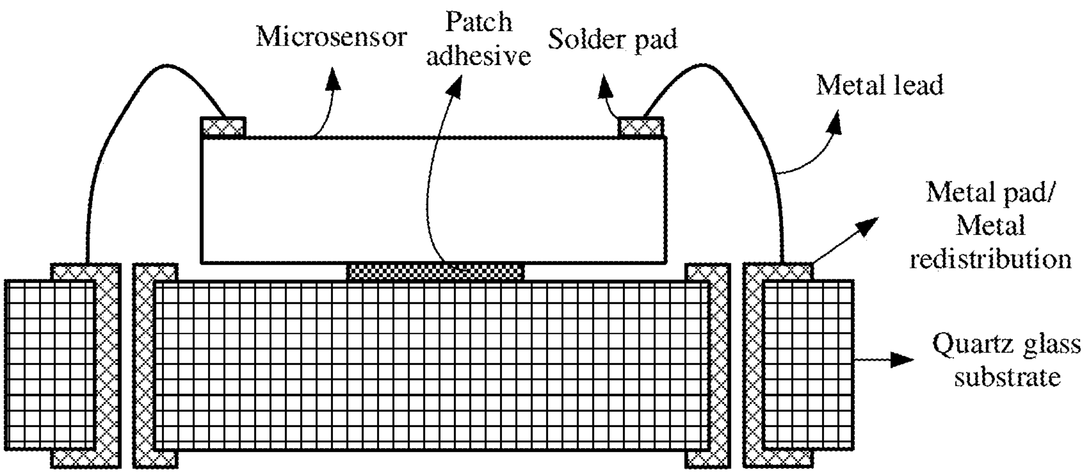
FIG. 12 is an example schematic diagram of a cross section of an encapsulation structure that uses a quartz glass substrate and that is applicable to another embodiment of this application.

FIG. 12 is a schematic diagram of a cross section of an encapsulation structure that uses a quartz glass substrate and that is applicable to another embodiment of this application.

As shown in FIG. 12, the encapsulation structure includes a multi-layer structure formed by stacking the microsensor, the patch adhesive, and the substrate from top to bottom. For example, the encapsulation structure may further include a solder pad, a metal lead, a metal pad, or metal redistribution. For details, refer to descriptions in FIG. 4.

In the structure shown in FIG. 12, the substrate layer may include a single-layer quartz glass. For example, the substrate layer is denoted as a quartz glass substrate. A difference between the structure shown in FIG. 10 and the structure shown in FIG. 12 lies in that in the structure shown in FIG. 12, an attachment area between the quartz glass substrate and the microsensor is changed.

As described above, an encapsulation stress of the microsensor layer may be related to one or more of the following: thickness of the quartz glass substrate, and the attachment area between the quartz glass substrate and the microsensor layer.

For example, the attachment area between the quartz glass substrate and the microsensor layer is adjusted, that is, an area of an attachment material between the quartz glass substrate and the microsensor layer is adjusted, as shown in FIG. 12.

When the attachment area between the quartz glass substrate and the microsensor layer is changed, deformation caused by the stress of the microsensor changes accordingly. Therefore, attachment areas between the quartz glass substrate and the microsensor layer may be continuously changed, to determine an attachment area between the quartz glass substrate and the microsensor layer when deformation of the microsensor is the smallest. Therefore, this can implement low-stress encapsulation of the microsensor.

For example, when thickness of the quartz glass substrate is fixed, patch adhesive areas between the quartz glass substrate and the microsensor layer may be continuously changed, to change an encapsulation stress caused by a mismatch between a coefficient of thermal expansion of a material of the quartz glass substrate and a coefficient of thermal expansion of a material of the microsensor in a controllable manner. Specifically, for example, a center attachment manner may be used to change the patch adhesive area between the quartz glass substrate and the microsensor. For example, the patch adhesive areas between the quartz glass substrate and the microsensor are separately ½, ⅓, ¼, and ⅕ of an area of the bottom of the microsensor. The microsensor is separately attached to the quartz glass substrates by using patch adhesives with different areas, and deformation of the microsensor is measured after curing and cooling. For example, when attachment strength is ensured, an attachment area corresponding to smallest deformation of the microsensor may be selected as an optimal attachment area.

Figure 13:
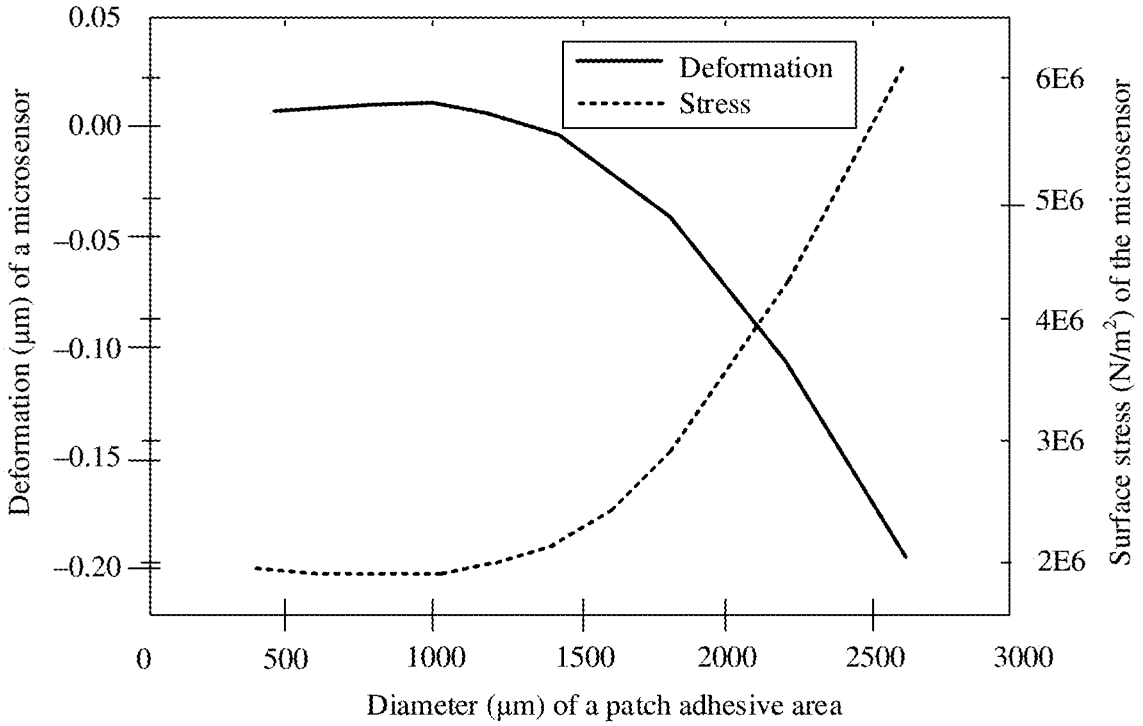
FIG. 13 is an example schematic diagram of a simulation result of a relationship between a stress and deformation of a microsensor and a patch adhesive area when a quartz glass substrate is used.

FIG. 13 is a schematic diagram of a simulation result of a relationship between a stress and deformation of the microsensor and the patch adhesive area when the quartz glass substrate is used.

For example, it is assumed that total thickness and sizes of the microsensor and the quartz glass substrate are determined. For example, the microsensor uses monocrystalline silicon, and the size of the microsensor is 3×4×0.5. The size of the quartz glass substrate is 5×4×0.5. Units of the size of the microsensor and the size of the quartz glass substrate are all described by using mm as an example. The patch adhesive is made from epoxy resin in a central attachment manner, and an attachment area is round-shaped.

In the schematic diagram shown in FIG. 13, a horizontal axis indicates a diameter of the patch adhesive area, namely, a diameter of the patch adhesive area between the microsensor and the quartz glass substrate, and a unit is μm. Vertical axes indicate a surface stress and deformation of the microsensor. A unit of the surface stress of the microsensor is $N/m^2$, and a unit of deformation of the microsensor is μm. It can be seen from FIG. 13, the patch adhesive area between the microsensor and the quartz glass substrate is changed, to adjust the encapsulation stress and deformation of the microsensor. As the patch adhesive area between the microsensor and the quartz glass substrate increases, the surface stress and deformation of microsensors increase. When attachment strength is ensured, and deformation caused by the stress of the microsensor is required to be in a range (for example, ±0.1 μm), the patch adhesive area (for example, the diameter of the patch adhesive area is less than 2200 μm) corresponding to deformation less than 0.1 μm may be selected as an optimal attachment area. Therefore, this can implement low-stress encapsulation of the microsensor.

It should be understood that FIG. 13 is merely a schematic diagram of a possible simulation result, and does not limit the protection scope of embodiments of this application.

It should further be understood that the structure shown in FIG. 12 is merely an example for description, and any variation of the structure shown in FIG. 12 falls within the protection scope of embodiments of this application. For example, the quartz glass substrate and the microsensor layer may be attached by using a plurality of spaced patch adhesives. For another example, the quartz glass substrate and the microsensor layer may be attached in a non-center attachment manner by using a patch adhesive.

It should further be understood that, in the quartz glass substrate, the attachment area between the quartz glass substrate and the microsensor layer may vary with the structure of the microsensor. Therefore, attachment areas between the quartz glass substrate and the microsensor layer may be continuously changed, to determine an optimal attachment area between the quartz glass substrate and the microsensor layer when deformation of the microsensor is the smallest.

In the structure shown in FIG. 12, the patch adhesive area between the quartz glass substrate and the microsensor layer is adjusted, to adjust the encapsulation stress of the microsensor, and further adjust deformation of the microsensor. In addition, a process of the method is simple.

The foregoing describes adjustment of the thickness of the quartz glass substrate with reference to FIG. 10, and describes adjustment of the attachment area between the quartz glass substrate and the microsensor layer with reference to FIG. 12. It should be understood that, in this embodiment of this application, both the thickness of the quartz glass substrate and the attachment area between the quartz glass substrate and the microsensor layer may be adjusted. This can further reduce the encapsulation stress of the microsensor.

The foregoing shows schematic diagrams of the possible encapsulation structure applicable to embodiments of this application with reference to FIG. 4 to FIG. 13. Based on the encapsulation structure of the microsensor provided in embodiments of this application, the thickness of the quartz glass substrate, the thickness proportion of the quartz glass to the second-type material in the substrate with a multi-layer structure and/or the contact area (or the attachment area) between the quartz glass and the second-type material in the substrate with a multi-layer structure, or the proportion of the quartz glass to the second-type material in the composite material substrate may be adjusted, to adjust properties of the materials in the substrate in a controllable manner, so that the effective coefficients of thermal expansion of the substrate and the patch adhesive approach the coefficient of thermal expansion of the substrate of the microsensor. This reduces the encapsulation stress, and reduces deformation of the microsensor.

Figure 14:
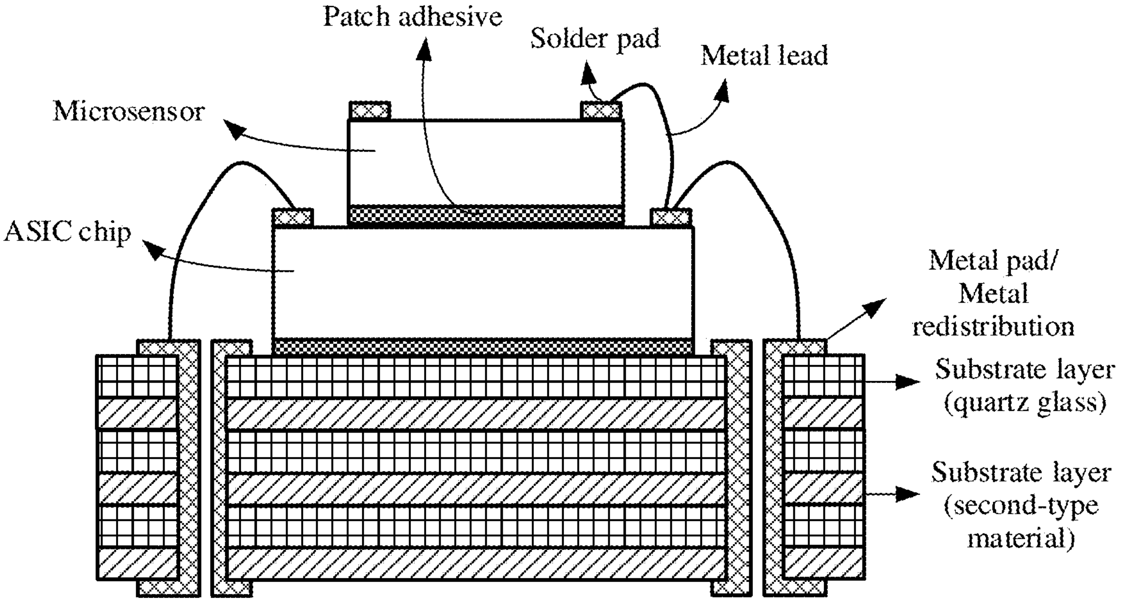
FIG. 14 shows an example schematic diagram of a cross section of a stacked structure of a sensor die and a dedicated readout circuit die of the sensor die.

A specific form of the MEMS device (for example, the microsensor) is not limited in embodiments of this application. For example, the microsensor mentioned in embodiments of this application may be a sensor die, or a stacked structure of a sensor die and a dedicated interface circuit die of the sensor die. FIG. 14 shows a schematic diagram of a cross section of a stacked structure of a sensor die and a dedicated readout circuit die of the sensor die by using the structure of the substrate shown in FIG. 4. As shown in FIG. 14, the microsensor and an application-specific integrated circuit (ASIC) chip may be stacked, and the microsensor and the ASIC chip may be attached by using an attachment material (for example, a patch adhesive).

Figure 15:
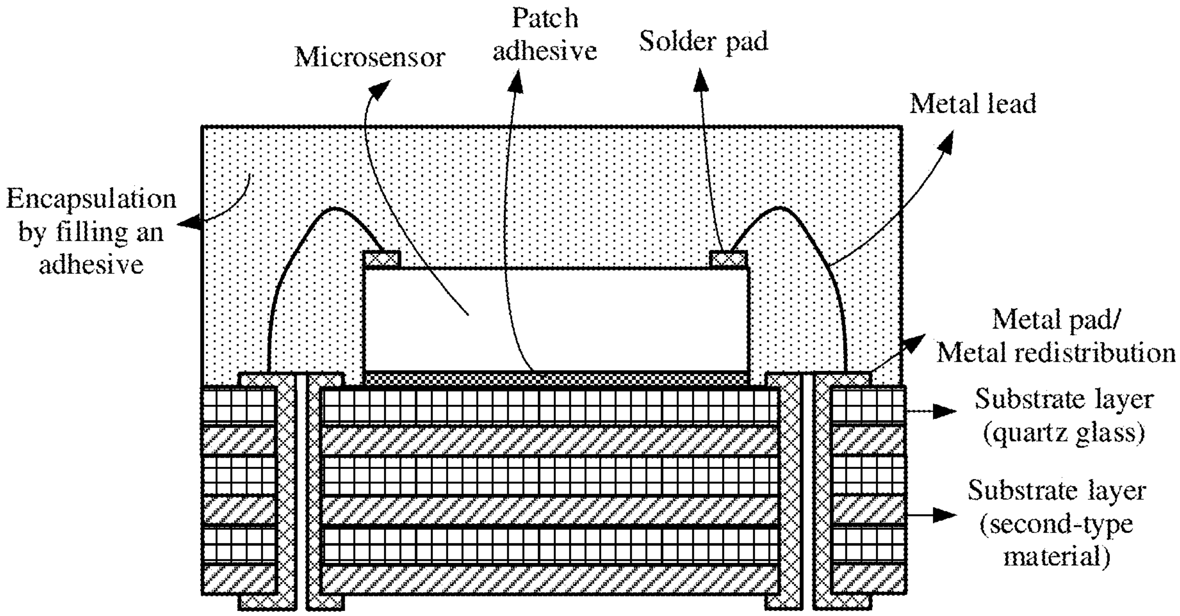
FIG. 15 is an example schematic diagram of a cross section of an encapsulation structure obtained through plastic encapsulation by filling an adhesive.

Optionally, based on the encapsulation structure (for example, any one of the foregoing encapsulation structures), an adhesive may be filled from a front surface of the microsensor, to implement sealed encapsulation of the microsensor. FIG. 15 shows a schematic diagram of a cross section of a stacked structure of a sensor die and a dedicated readout circuit die of the sensor die by using the encapsulation structure shown in FIG. 4. FIG. 15 is a schematic diagram of a cross section of an encapsulation structure obtained through plastic encapsulation by filling an adhesive. As shown in FIG. 15, sealed encapsulation of the microsensor may be implemented by filling the adhesive. It should be understood that FIG. 15 is merely an example for description, any manner that can implement encapsulation is applicable to this embodiment of this application.

It should be understood that some embodiments are mainly described by using an example in which smallest deformation of the microsensor is selected as a target. This is not limited. For example, the target may be deformation of the microsensor that is less than a specific value or in a specific range. Alternatively, an appropriate substrate may be selected based on an actual requirement.

It should further be understood that some embodiments are described by using an example in which a contact area between two adjacent layers in the substrate with a multi-layer structure is changed, or an attachment area between two adjacent layers in the composite material substrate is changed. This is not limited. Any manner of changing a direct contact area or an indirect contact area in the substrate with a multi-layer structure or the composite material substrate is applicable to embodiments of this application.

It should further be understood that, in some embodiments, for a specific process, for example, attaching the microsensor to the substrate by using the adhesive material, refer to an existing manner. This is not limited.

It should be understood that some embodiments are described by using the microsensor as an example. This is not limited. The microsensor may be replaced with any type of MEMS device. Alternatively, when another device is attached to the substrate by using the adhesive material, the substrate provided in embodiments of this application may also be used, so that an encapsulation stress and deformation generated by the device are controllable.

The foregoing describes in detail the apparatus embodiments of this application with reference to FIG. 3 to FIG. 15. The following describes in detail the method embodiments of this application with reference to FIG. 16 to FIG. 18. Descriptions on the method side correspond to the descriptions on the apparatus side. For brevity, repeated descriptions are appropriately omitted.

Figure 16:
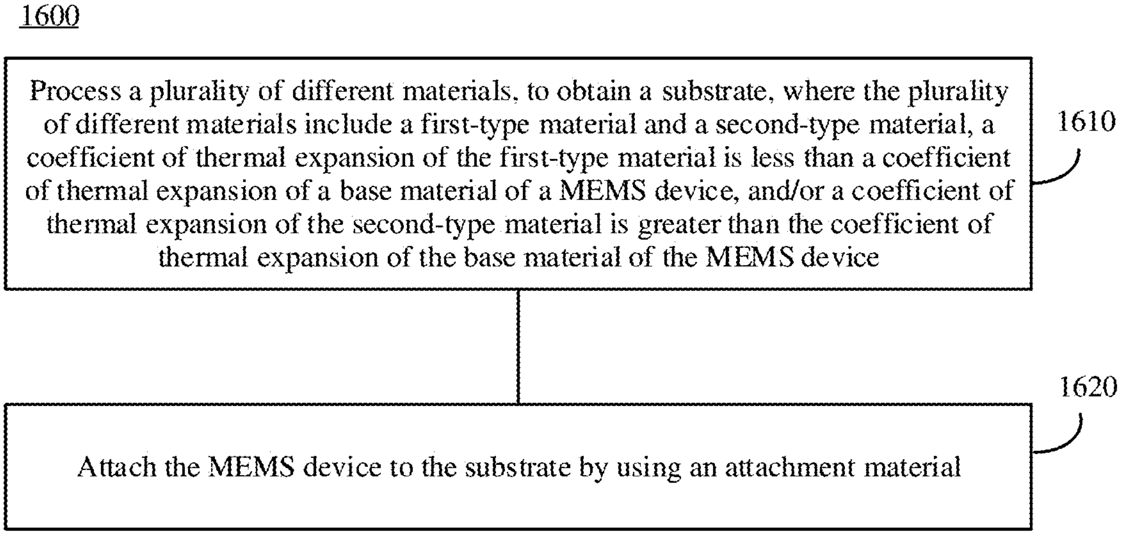
FIG. 16 is an example schematic block diagram of an encapsulation method 1600 according to some embodiments of this application.

FIG. 16 is a schematic block diagram of an encapsulation method 1600 according to some embodiments of this application.

1610: Process a plurality of different materials, to obtain a substrate, where the plurality of different materials include a first-type material and a second-type material, a coefficient of thermal expansion of the first-type material is less than a coefficient of thermal expansion of a base material of a MEMS device, and/or a coefficient of thermal expansion of the second-type material is greater than the coefficient of thermal expansion of the base material of the MEMS device.

1620: Attach the MEMS device to the substrate by using an attachment material.

In some embodiments, the first-type material includes quartz glass; and/or the second-type material includes one or more of the following: aluminum oxide, silicon nitride, and aluminum nitride.

In some embodiments, the processing a plurality of different materials, to obtain a substrate includes: stacking the plurality of different materials, to obtain the substrate with a multi-layer structure. For the substrate with a multi-layer structure, refer to the manner 1 in the solution 1.

In some embodiments, materials of adjacent layers in the multi-layer structure are different.

In some embodiments, the encapsulation method 1600 further includes one or more of the following: adjusting a thickness proportion of each layer in the multi-layer structure, to control an encapsulation stress of the MEMS device; adjusting a contact area or an attachment area between layers in the multi-layer structure, to control the encapsulation stress of the MEMS device; and adjusting an attachment area between the multi-layer structure and the MEMS device, to control the encapsulation stress of the MEMS device. For example, the thickness proportion of each layer in the multi-layer structure is adjusted, to obtain the encapsulation structure shown in FIG. 4. For another example, the contact area between the layers in the multi-layer structure is adjusted, to obtain the encapsulation structure shown in FIG. 6. For another example, the attachment area between the layers in the multi-layer structure is adjusted, to obtain the encapsulation structure shown in FIG. 7.

In some embodiments, the stacking a plurality of different materials includes: bonding the plurality of different materials in a die-level or wafer-level bonding manner; growing or depositing the plurality of different materials in a film growth manner; or attaching the plurality of different materials in an attachment manner.

In some embodiments, the processing a plurality of different materials, to obtain a substrate includes: mixing the plurality of different materials based on a preset proportion, to obtain the substrate.

In some embodiments, the encapsulation method 1600 further includes: adjusting the proportions of the plurality of different materials, to control an encapsulation stress of the MEMS device. For example, the plurality of materials are adjusted, to obtain the encapsulation structure shown in FIG. 9.

Figure 17:
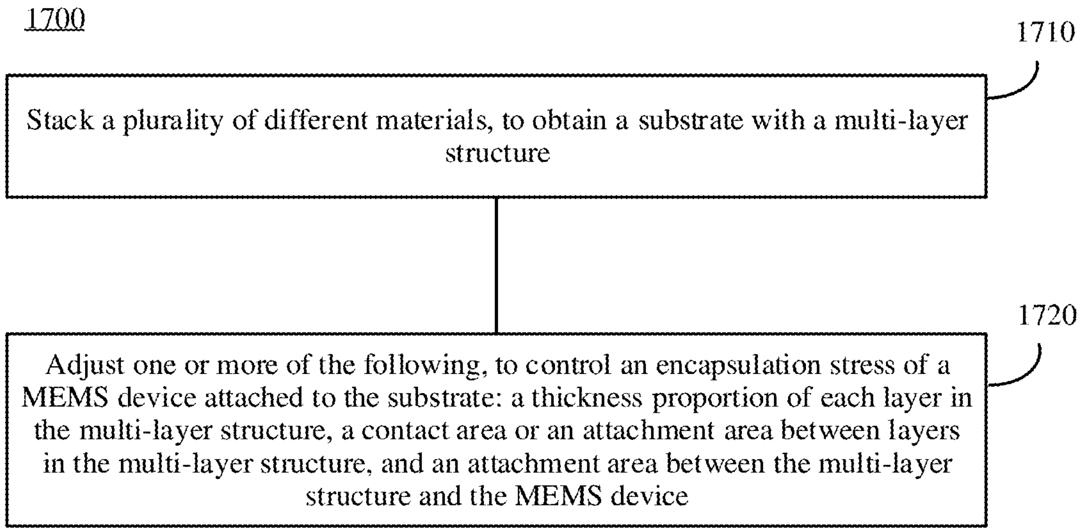
FIG. 17 is an example schematic block diagram of a method 1700 according to some embodiments of this application.

FIG. 17 is a schematic block diagram of a method 1700 according to some embodiments of this application.

1710: Stack a plurality of different materials, to obtain a substrate with a multi-layer structure.

1720: Adjust one or more of the following, to control an encapsulation stress of a MEMS device attached to the substrate: a thickness proportion of each layer in the multi-layer structure, a contact area or an attachment area between layers in the multi-layer structure, and an attachment area between the multi-layer structure and the MEMS device.

In some embodiments, the plurality of different materials include a first-type material and a second-type material, a coefficient of thermal expansion of the first-type material is less than a coefficient of thermal expansion of a base material of the MEMS device, and/or a coefficient of thermal expansion of the second-type material is greater than the coefficient of thermal expansion of the base material of the MEMS device.

In some embodiments, materials of adjacent layers in the multi-layer structure are different.

In some embodiments, the stacking a plurality of different materials includes: bonding the plurality of different materials in a die-level or wafer-level bonding manner; growing or depositing the plurality of different materials in a film growth manner; or attaching the plurality of different materials in an attachment manner.

For the substrate obtained by using the method 1700, refer to the substrate in the manner 1 in the solution 1.

Figure 18:
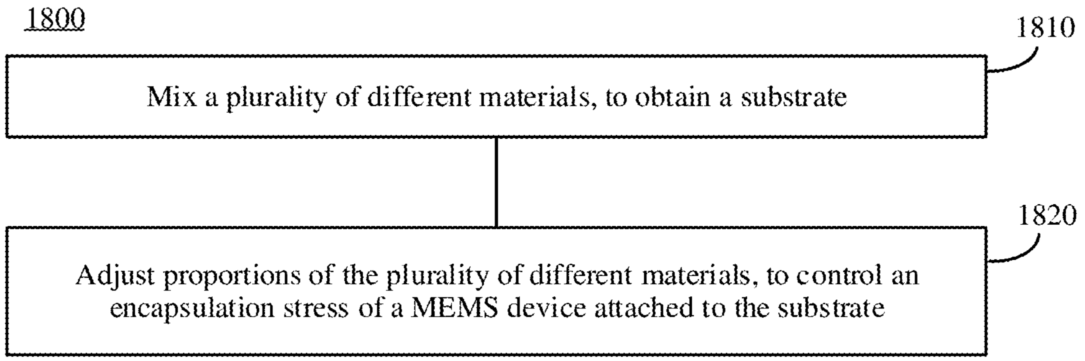
FIG. 18 is an example schematic block diagram of a method 1800 according to some embodiments of this application.

FIG. 18 is a schematic block diagram of a method 1800 according to some embodiments of this application.

1810: Mix a plurality of different materials, to obtain a substrate.

1820: Adjust proportions of the plurality of different materials, to control an encapsulation stress of a MEMS device attached to the substrate.

In some embodiments, the plurality of different materials include a first-type material and a second-type material, a coefficient of thermal expansion of the first-type material is less than a coefficient of thermal expansion of a base material of the MEMS device, and/or a coefficient of thermal expansion of the second-type material is greater than the coefficient of thermal expansion of the base material of the MEMS device.

For the substrate obtained by using the method 1800, refer to the substrate in the manner 2 in the solution 1.

A person of ordinary skill in the art may be aware that, with reference to the examples described in embodiments disclosed in this specification, steps may be implemented by electronic hardware or a combination of computer software and electronic hardware. Whether the functions are executed by hardware or software depends on particular applications and implementation constraints of the technical solutions. A person skilled in the art may use different methods to implement the described functions for each particular application, but it should not be considered that the implementation goes beyond the protection scope of this application.

A person skilled in the art may clearly understand that, for the purpose of convenient and brief description, for a detailed working process of the foregoing method, refer to a corresponding process in the apparatus embodiments. All or some of the foregoing embodiments may be implemented by software, hardware, firmware, or any combination thereof.

When software is used to implement embodiments, all or some of embodiments may be implemented in a form of a computer program product. The computer program product includes one or more computer instructions. When the computer program instructions are loaded and executed on a computer, the procedure or functions according to embodiments of this application are all or partially generated. The computer may be a general-purpose computer, a dedicated computer, a computer network, or another programmable apparatus. For example, the computer may be a personal computer, a server, a network device, or the like. The computer instructions may be stored in a computer-readable storage medium or may be transmitted from a computer-readable storage medium to another computer-readable storage medium. For example, the computer instructions may be transmitted from a website, computer, server, or data center to another website, computer, server, or data center in a wired (for example, a coaxial cable, an optical fiber, or a digital subscriber line (DSL)) or wireless (for example, infrared, radio, or microwave) manner. For the computer-readable storage medium, refer to the foregoing descriptions.

The foregoing descriptions are merely specific implementations of this application, but the protection scope of this application is not limited thereto. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. An encapsulation structure, comprising:
a micro-electromechanical system (MEMS) device;
a substrate having a plurality of different materials; and
an attachment material located between the MEMS device and the substrate, wherein
the plurality of different materials include a first-type material and a second-type material,
a coefficient of thermal expansion of the first-type material is less than a coefficient of thermal expansion of a base material of the MEMS device, and/or a coefficient of thermal expansion of the second-type material is greater than the coefficient of thermal expansion of the base material of the MEMS device, and
the attachment material is configured to attach the MEMS device to the substrate,
wherein the substrate is formed by mixing the plurality of different materials based on a specified proportion corresponding to a smallest deformation of the MEMS device.

2. The encapsulation structure according to claim 1, wherein
the first-type material includes quartz glass, and/or
the second-type material includes one or more of: aluminum oxide, silicon nitride, and aluminum nitride.

3. The encapsulation structure according to claim 1, wherein the substrate is a multi-layer structure formed by stacking the plurality of different materials.

4. The encapsulation structure according to claim 3, wherein adjacent layers in the multi-layer structure are made of different materials.

5. The encapsulation structure according to claim 3, wherein the MEMS device includes an encapsulation stress related to one or more of:
a thickness proportion of each layer in the multi-layer structure, a contact area or an attachment area between layers in the multi-layer structure, and an attachment area between the multi-layer structure and the MEMS device.

6. The encapsulation structure according to claim 3, wherein
the substrate is prepared by bonding the plurality of different materials in a die-level or wafer-level bonding manner,
the substrate is prepared by growing or depositing the plurality of different materials in a film growth manner, or
the substrate is formed by attaching the plurality of different materials in an attachment manner.

7. The encapsulation structure according to claim 1, wherein the MEMS device includes an encapsulation stress related to proportions of the plurality of different materials in the substrate.

8. The encapsulation structure according to claim 1, wherein
a material of the MEMS device includes one or more of: monocrystalline silicon, silicon carbide, diamond, and gallium nitride, and/or
the attachment material includes one or more of: epoxy resin, a resin alternative, metal solder, and glass powder.

9. The encapsulation structure according to claim 1, wherein the specified proportion comprises at least one of a mass proportion of the first-type material in the substrate, a mass proportion of the first-type material to the second-type material in the substrate, or a mass proportion of the second-type material in the substrate.

10. The encapsulation structure according to claim 1, wherein the specified proportion is selected from a plurality of different proportions.

11. A substrate, comprising:
a plurality of materials including, at least, a first-type material and a second-type material, wherein
a coefficient of thermal expansion of the first-type material is less than a coefficient of thermal expansion of a base material of a micro-electromechanical system (MEMS) device, and/or a coefficient of thermal expansion of the second-type material is greater than the coefficient of thermal expansion of the base material of the MEMS device, and
the substrate is connected to the MEMS device by using an attachment material,
wherein the substrate is formed by mixing the plurality of different materials based on a specified proportion corresponding to a smallest deformation of the MEMS device.

12. The substrate according to claim 11, wherein
the first-type material includes quartz glass, and/or
the second-type material includes one or more of: aluminum oxide, silicon nitride, and aluminum nitride.

13. The substrate according to claim 11, wherein the substrate is a multi-layer structure formed by stacking the plurality of materials.

14. The substrate according to claim 13, wherein adjacent layers in the multi-layer structure are made of different materials.

15. The substrate according to claim 13, wherein the MEMS device includes an encapsulation stress related to one or more of:
a thickness proportion of each layer in the multi-layer structure, a contact area or an attachment area between layers in the multi-layer structure, and an attachment area between the multi-layer structure and the MEMS device.

16. The substrate according to claim 13, wherein
the substrate is prepared by bonding the plurality of materials in a die-level or wafer-level bonding manner, the substrate is prepared by growing or depositing the plurality of materials in a film growth manner, or the substrate is formed by attaching the plurality of materials in an attachment manner.

17. The substrate according to claim 11, wherein the MEMS device includes an encapsulation stress related to proportions of the plurality of materials in the substrate.

18. An encapsulation method, comprising:

obtaining a substrate by processing a plurality of different materials, wherein the plurality of different materials include a first-type material and a second-type material, a coefficient of thermal expansion of the first-type material is less than a coefficient of thermal expansion of a base material of a micro-electromechanical system (MEMS) device, and/or a coefficient of thermal expansion of the second-type material is greater than the coefficient of thermal expansion of the base material of the MEMS device, the plurality of different materials are mixed to form the substrate based on a specified proportion corresponding to a smallest deformation of the MEMS device; and attaching the MEMS device to the substrate by using an attachment material.

19. The encapsulation method according to claim 18, wherein the first-type material includes quartz glass, and/or the second-type material includes one or more of: aluminum oxide, silicon nitride, and aluminum nitride.

20. The encapsulation method according to claim 18, wherein obtaining the substrate by processing the plurality of different materials comprises:

stacking the plurality of different materials and obtaining the substrate with a multi-layer structure.

* * * * *